United States Patent
Kazlas et al.

(10) Patent No.: US 10,056,523 B2
(45) Date of Patent: *Aug. 21, 2018

(54) DEVICE INCLUDING QUANTUM DOTS

(71) Applicant: SAMSUNG RESEARCH AMERICA, INC., Mountain View, CA (US)

(72) Inventors: Peter T. Kazlas, Sudbury, MA (US); John Spencer Morris, Houston, TX (US); Robert J. Nick, Pepperell, MA (US); Zoran Popovic, Mississauga (CA); Matthew Stevenson, Long Beach, CA (US); Jonathan S. Steckel, Saratoga, CA (US)

(73) Assignee: SAMSUNG RESEARCH AMERICA, INC., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/350,068

(22) Filed: Nov. 13, 2016

(65) Prior Publication Data

US 2017/0125633 A1    May 4, 2017

Related U.S. Application Data

(63) Continuation of application No. 13/468,199, filed on May 10, 2012, now Pat. No. 9,496,141, which is a
(Continued)

(51) Int. Cl.
*H01L 33/06* (2010.01)
*H01L 33/00* (2010.01)
(Continued)

(52) U.S. Cl.
CPC ........ *H01L 33/06* (2013.01); *H01L 21/02664* (2013.01); *H01L 33/005* (2013.01); *B82Y 20/00* (2013.01); *B82Y 40/00* (2013.01)

(58) Field of Classification Search
CPC ......... H01L 21/02664; H01L 21/02601; H01L 21/0237; H01L 33/06; C09K 11/565; C09K 11/883; B82Y 20/00; B82Y 40/00
(Continued)

(56) References Cited

U.S. PATENT DOCUMENTS

| 4,201,598 A | 5/1980 | Tanaka et al. |
| 5,557,436 A | 9/1996 | Blose et al. |

(Continued)

FOREIGN PATENT DOCUMENTS

| KR | 1020080043829 A | 5/2008 |
| WO | WO-2000017655 | 3/2000 |

(Continued)

OTHER PUBLICATIONS

Achermann et al., "Multiexcitons confined within a subexecitonic volume: Spectroscopic and dynamical signatures of neutral and charged biexcitons in ultrasmall semiconductor nanocrystals", *Phys. Rev. B*, vol. 68 (24) (2003), No. 245302 pp. 1-5.
(Continued)

*Primary Examiner* — Fernando L Toledo
*Assistant Examiner* — Aaron Gray
(74) *Attorney, Agent, or Firm* — Cantor Colburn LLP

(57) ABSTRACT

A method of making a device comprises forming a layer comprising quantum dots over a substrate including a first electrode, fixing the layer comprising quantum dots formed over the substrate, and exposing at least a portion of, and preferably all, exposed surfaces of the fixed layer comprising quantum dots to small molecules. The layer comprising quantum dots can be preferably fixed in the absence or substantial absence of oxygen. Also disclosed is a method of making a device comprises forming a layer comprising quantum dots over a substrate including a first electrode, exposing the layer comprising quantum dots to small mol-
(Continued)

ecules and light flux. Also disclosed is a method of making a film including a layer comprising quantum dots, the method comprising forming a layer comprising quantum dots over a carrier substrate, fixing the layer comprising quantum dots formed over the carrier substrate, and exposing at least a portion of, and preferably all, exposed surfaces of the fixed layer comprising quantum dots to small molecules. The layer comprising quantum dots can be preferably fixed in the absence or substantial absence of oxygen. Also disclosed is a method of preparing a device component including a layer comprising quantum dots, the method comprising forming a layer comprising quantum dots over a layer comprising a charge transport material, exposing the layer comprising quantum dots to small molecules and light flux. Devices, device components, and films are also disclosed.

20 Claims, 6 Drawing Sheets

Related U.S. Application Data continuation of application No. PCT/US2010/056397, filed on Nov. 11, 2010.

(60) Provisional application No. 61/260,388, filed on Nov. 11, 2009, provisional application No. 61/262,501, filed on Nov. 18, 2009, provisional application No. 61/377,242, filed on Aug. 26, 2010, provisional application No. 61/377,125, filed on Aug. 26, 2010, provisional application No. 61/377,148, filed on Aug. 26, 2010.

(51) Int. Cl.
  *H01L 21/02* (2006.01)
  *B82Y 40/00* (2011.01)
  *B82Y 20/00* (2011.01)

(58) Field of Classification Search
  USPC ........ 257/9, 13, 79, 103, E29.168, E29.071; 438/22, 962; 997/949, 952, 774
  See application file for complete search history.

(56) References Cited

U.S. PATENT DOCUMENTS

| | | | |
|---|---|---|---|
| 6,048,616 A | 4/2000 | Gallagher | |
| 6,319,426 B1 | 11/2001 | Bawendi et al. | |
| 6,322,901 B1 | 11/2001 | Bawendi et al. | |
| 6,576,291 B2 | 6/2003 | Bawendi et al. | |
| 6,939,604 B1 | 9/2005 | Guyot-Sionnest et al. | |
| 7,160,613 B2 | 1/2007 | Bawendi et al. | |
| 7,227,177 B2 | 6/2007 | Guyot-Sionnest et al. | |
| 7,288,468 B2 | 10/2007 | Jang et al. | |
| 7,364,925 B2 | 4/2008 | Lee et al. | |
| 7,615,800 B2 | 11/2009 | Kahen | |
| 7,772,551 B2 | 8/2010 | Todori et al. | |
| 8,334,527 B2 | 12/2012 | Iizumi et al. | |
| 9,496,141 B2 * | 11/2016 | Kazlas | B82Y 10/00 |
| 2003/0194731 A1 | 10/2003 | Sato et al. | |
| 2004/0000868 A1 | 1/2004 | Shimizu et al. | |
| 2004/0023010 A1 | 2/2004 | Bulovic et al. | |
| 2004/0091710 A1 | 5/2004 | Bawendi et al. | |
| 2004/0118448 A1 | 6/2004 | Scher et al. | |
| 2004/0151898 A1 | 8/2004 | Reiss et al. | |
| 2004/0245912 A1 | 12/2004 | Thurk et al. | |
| 2004/0262583 A1 | 12/2004 | Lee et al. | |
| 2005/0134723 A1 | 6/2005 | Lee et al. | |
| 2005/0218377 A1 | 10/2005 | Lawandy | |
| 2005/0258418 A1 | 11/2005 | Steckel et al. | |
| 2005/0266246 A1 | 12/2005 | Reiss et al. | |
| 2006/0003465 A1 | 1/2006 | Zhukov et al. | |
| 2006/0067602 A1 | 3/2006 | Todori et al. | |
| 2006/0068090 A1 | 3/2006 | Monbouquette et al. | |
| 2006/0174821 A1 | 8/2006 | Sato et al. | |
| 2006/0196375 A1 | 9/2006 | Coe-Sullivan et al. | |
| 2007/0057263 A1 | 3/2007 | Kahen | |
| 2007/0069202 A1 | 3/2007 | Choi et al. | |
| 2007/0103068 A1 | 5/2007 | Bawendi et al. | |
| 2007/0221947 A1 | 9/2007 | Locascio et al. | |
| 2007/0259206 A1 | 11/2007 | Oshio | |
| 2008/0001167 A1 | 1/2008 | Coe-Sullivan et al. | |
| 2008/0038558 A1 | 2/2008 | Lindry et al. | |
| 2008/0188063 A1 | 8/2008 | Alivisatos et al. | |
| 2008/0237540 A1 | 10/2008 | Dubrow | |
| 2008/0258115 A1 | 10/2008 | Ying et al. | |
| 2008/0296534 A1 | 12/2008 | Lifshitz et al. | |
| 2009/0087792 A1 | 4/2009 | Ilzumi et al. | |
| 2009/0215208 A1 | 8/2009 | Coe-Sullivan et al. | |
| 2009/0278141 A1 | 11/2009 | Coe-Sullivan et al. | |
| 2010/0051901 A1 | 3/2010 | Kazlas et al. | |
| 2010/0132770 A1 | 6/2010 | Beatty et al. | |
| 2010/0134520 A1 | 6/2010 | Coe-Sullivan | |
| 2010/0265307 A1 | 10/2010 | Linton et al. | |
| 2010/0068468 A1 | 11/2010 | Coe-Sullivan et al. | |
| 2010/0283014 A1 | 11/2010 | Breen et al. | |
| 2011/0006281 A1 | 1/2011 | Jang et al. | |
| 2011/0103064 A1 | 5/2011 | Coe-Sullivan et al. | |
| 2011/0140075 A1 | 6/2011 | Zhou et al. | |
| 2011/0245533 A1 | 10/2011 | Breen et al. | |
| 2011/0284819 A1 | 11/2011 | Kang et al. | |
| 2011/0291071 A1 | 12/2011 | Kim et al. | |
| 2012/0187367 A1 | 7/2012 | Modi et al. | |
| 2012/0189791 A1 | 7/2012 | Modi et al. | |
| 2012/0292594 A1 | 11/2012 | Zhou et al. | |
| 2013/0009131 A1 | 1/2013 | Kazlas et al. | |

FOREIGN PATENT DOCUMENTS

| | | |
|---|---|---|
| WO | WO-2003021635 A2 | 3/2003 |
| WO | WO-2008063657 A2 | 5/2008 |
| WO | WO-2010129350 A2 | 11/2010 |
| WO | WO-2010129350 A3 | 11/2010 |
| WO | WO-2010129374 A2 | 11/2010 |
| WO | WO-2010129374 A3 | 11/2010 |
| WO | WO 2011005023 A2 | 1/2011 |
| WO | WO-2011060180 A1 | 5/2011 |

OTHER PUBLICATIONS

Adachi, C., et al., "Nearly 100% Internal Phosphorescence Efficiency in an Organic Light emitting Device," *J. Appl. Phys.* 90, 5048-5051 (2001).
Anikeeva, et al., "Photoluminescence of CdSe/ZnS core/shell quantum dots enhanced by energy transfer from a phosphorescent donor", Chem. Phys. Lett. (2006) vol. 424, pp. 120-125.
Anikeeva, et al., "Quantum Dot Light-Emitting Devices with Electroluminescence Tunable over the Entire Visible Spectrum," *Nano Letters* 9, pp. 2532-2536 (2009).
Asami, H. et al., "Photobrightening and Photodarkening in CdSe Nanocrystal/Polymer Thin Films", *Intl. Jrnl. Of Nanoscience*, vol. 1, Nos. 5&6 (2002), pp. 041-044.
Asami, H. et al., "Surface State Analysis of Photobrightening in CdSe Nanocrystal Thin Films", *J. Phys. Chem B* (2003), vol. 107, pp. 12566-12568.
Baldo, M.A., et al., "Highly Efficient Phosphorescent Emission from Organic Electroluminescent Devices," *Nature* 395, 151-154.
Bulovic, V., et al., "A Surface-Emitting Vacuum-Deposited Organic Light Emitting Device," *Appl. Phys. Lett.* 70, 2954-2956 (1997).
Bulovic, V., et al., "Transparent light-emitting devices", *Nature* 380, p. 29 (1996).
Carrillo-Carrion, C. et al., "Quantum dots luminescence enhancement due to illumination with UV/Vis light" *ChemComm*, 2009.
Carter, et al., "Enhanced luminance in polymer composite light emitting devices", *Appl. Phys. Lett.*, vol. 71 (9), p. 1145, Sep. 1, 1997.

(56) References Cited

OTHER PUBLICATIONS

Caruge, et al., "Colloidal quantum-dot light-emitting diodes with metal-oxide charge transport layers," *Nature Photonics* 2, pp. 247-250 (2008).

Cho, et al., "High-performance Crosslinked Colloidal Quantum-dot Light-emitting diodes," *Nature Photonics* 3, pp. 341-345 (2009).

Choi, S.-H., et al., "Synthesis of size-controlled CdSe quantum dots and characterization of CdSe-conjugated polymer blends for hybrid solar cells", Journal of Photochemistry and Photobiology A: Chemistry, vol. 179, Issues 1-2, Apr. 1, 2006, pp. 135-141.

Chon, J.W.M. et al., "Two-photon-induced photoenhancement of densely packed CdSe/ZnSe/ZnS Nanocrystal Solids and its Application to Multilayer Optical Data Storage", *Appl. Phys. Lett.*, vol. 85, No. 23, (2004), pp. 5514-5516.

Cordero, et al., "Photo-Activated Luminescence of CdSe Quantum Dot Monolayers," *J. Phys. Chem B*. 104, pp. 12137-12142 (2000).

Dabbousi, B.O., et al., "(CdSe)ZnS Core-Shell Quantum Dots: Synthesis and Characterization of a Size Series of Highly Luminescent Nanocrystallites", J. Phys. Chem. B 1997, 101, 9463-9475.

Duncan, T. et al. "Improving the Quantum Yields of Semiconductor Quantum Dots Through Photoenhancement Assisted by Reducing Agents", *J. Phys. Chem.*, (2009), vol. 113, pp. 7561-7566.

Efros, et al., "Band-Edge Exciton in Quantum Dots of Semiconductors with a Degenerate Valence Band: Dark and Bright Exciton States," Phys. Rev. B 54, 4843-4856 (1996).

Farmer, S.C. et al., "Photoluminescent Polymer/Quantum Dot Composite Nanoparticles", *Chem. Mater.*, (2001), vol. 13, pp. 3920-3926.

Firth, A. et al., "Optical properties of CdSe nanocrystals in a polymer matrix", *Appl. Phys. Lett.*, vol. 75, No. 20 (1999), pp. 3120-3122.

Forrest, S.R., et al., "Measuring the Efficiency of Organic Light Emitting Diodes," *Adv. Mater.* 15, 1043-1048 (2003).

Gomonnai, A.V. et al., "X-Ray Excited Luminescence and X-ray Irradiation, Effect on $CdS_{1-x}Se_x$ Nanocrystals Optical Absorption", vol. 3, No. 2, Jun. 2001, p. 509-514.

Gu, G., et al., "Transparent organic light emitting devices", *Appl. Phys. Lett.* 68, pp. 2606-2608, (1996).

Guyot-Sionnest, P. "Reduced and Oxidized Colloid Quantum Dots" CNRS Seminar, Grenoble, FR, Sep. 2004.

Haase, et al., "Photochemistry and Radiation Chemistry of Colloidal Semiconductors. 23. Electron Storage on ZnO Particles and Size Quantization", J. Phys. Chem., vol. 92, pp. 482-487 (1988).

Henglein, et al., "Photochemistry and Radiation Chemistry of Semiconductor Colloids: Reaction of the Hydrated Electron with CdS and Non-Linear Optical Effects", Chem. Phys. Lett., vol. 132, No. 2, pp. 133-136 (1986).

Hengqun et al., "Photoluminescence and Application of Nonlinear Optical Property of nc—Si—$SiO_2$ Films" *Chinese Journal of Semiconductors*, vol. 27 (2) (2006), pp. 345-348 (Chinese).

Hengqun et al., "Photoluminescence and Application of Nonlinear Optical Property of nc—Si—$SiO_2$ Films" *Chinese Journal of Semiconductors*, vol. 27 (2) (2006) (English—abstract only).

Hess, B.C. et al., "Surface Transformation and Photoinduced Recovery in CdSe Nanocrystals", *Phys. Rev. Lett.*, vol. 86, No. 14, pp. 3133-3135 (2001).

Huang, et al. "Bias-induced photoluminescence quenching of single colloidal quantum dots embedded in organic semiconductors", *Nano Letters* 2007, vol. 7, No. 12, pp. 3781-3786.

Ichikawa, M., et al., "Bipyridyl oxadiazoles as efficient and durable electron-transporting an hole-blocking molecular materials", J. Mater. Chem., 2006, 16, 221-225.

Jarosz, M.V., et al., "Photoconductivity studies of treated CdSe quantum dot films exhibiting increased exciton ionization efficiency", *Phys. Rev. B* 70, (2004), 195327.

Jones, M. et al., "Photoenhancement of Luminescence in Colloidal CdSe Quantum Dot Solutions", *J. Phys. Chem. B*, (2003) vol. 107, pp. 11346-11352.

Kazlas, P., et al., "Printable High Efficiency Quantum Dot Light Emitting Diodes for Information Displays," *XXIX International Display Research Conferenc, Eurodisplay* 2009, Rome, Italy, Sep. 14-17, 2009. Conference held at the University of Rome.

Kim, D. et al., "Layer-by-Layer Assembly of Colloidal Cds and ZnS—CdS Quantum Dots and Improvement of Their Photoluminescence Properties", *J. Phys. Chem.*, (2009), vol. 113, pp. 7015-7018.

Kim, K., et al., "Photoenhancement of a Quantum Dot Nanocomposite via UV Annealing and its Application to White LEDs" *Adv. Mater.*, 23, 911-914, 2011.

Korsunska, N.E. et al., "Reversible and non-reversible photo-enhanced luminescence in CdSe/ZnS quantum dots", *Semicond. Sci. Technol.*, vol. 20 (2005), pp. 876-881.

Lee, S. et al., "Brightening, Blinking, Bluing and Bleaching in the Life of a Quantum Dot: Friend or Foe", *ChemPhysChem*, (2009), 10, 2174-2191.

Lee, Y.L. et al., "Highly Efficient Quantum-Dot Sensitized Solar Cell Based on Co-Sensitization of CdS/CdSe", *Adv. Funct. Mater.*, vol. 19 (2009), pp. 604-609.

Liu, C. et al., "Temperature-dependent Brightening and Darkening of Photoluminescence from PbS Quantum Dots in Glasses", *Appl. Phys. Lett.* 90, 241111 (2007).

Mashford, et al., "All-inorganic quantum-dot light-emitting devices formed via low-cost, wet-chemical processing", *J. Mater. Chem.* 20, pp. 167-172 (2010).

Mashford, et al., "High-efficiency quantum-dot light-emitting devices with enhanced charge injection", *Nature Photonics* 7, pp. 407-412 (2013).

Miyoshi, T. et al., "Photodarkening and Photobrightening in Glasses Doped with CdS and $CdSxSe1-x$ Nanocrystals", *Jpn. J. Appl. Phys.*, vol. 39 (2000), pp. 6290-6292.

Müller, J., et al., Air-induced fluorescence bursts from single semiconductor nanocrystals:, Applied Physics Letters, 85, 381-383 (2004).

Murase, et al., "Anomalous Photoluminescence in Silica-Coated Semiconductor Nanocrystals After Heat Treatment" *Small* vol. 5, No. 7, pp. 800-803, (2009).

Murray, C. et al., "Synthesis and Characterization of Nearly Monodisperse CdE (E=S, Se, Te) Semiconductor Nanocrystallites", *J. Am. Chem. Soc.*, 115 pp. 8706 (1993).

Murray, C. "Synthesis and Characterization of II-VI Quantum Dots and Their Assembly into 3-D Quantum Dot Superlattices", Massachusetts Institute of Technology, Thesis, Sep. 1995.

Murray, C.B., et al., "Synthesis and Characterization of Monodisperse Nanocrystals and Close-Packed Nanocrystal Assemblies", Annual Review of Materials Science, vol. 30:545-610 (2000).

Nayak, M. et al., (2008)"Passivation of CdTe Nanoparticles by Silane Coupling Agent Assisted Silica Encapsulation", in 26th Annual Conference on Composites, Advanced Ceramics, Materials, and Structures: B: Ceramic Engineering and Science Proceedings, vol. 23, Issue 44.

Nazzal, A. et al., "Environmental Effects on Photoluminescence of Highly Luminescent CdSe and CdSe/ZnS Core/Shell Nanocrystals in Polymer Thin Films", *J. Phys. Chem. B*. 2004, vol. 108, pp. 5507-5515.

Oda, M., et al., "Reversible photobluing of CdSe/ZnS/TOPO nanocrystals", *Colloids and Surfaces B: Biointerfaces* (2007), vol. 56, pp. 241-245.

Oda, M., et al. "Photobrightening of CuBr Nanocrystals in PMMA", *J. of Luminescence*, vol. 87-89 (2000), pp. 469-471.

Oda, M. , et al., "Photoluminescence of CdSe/ZnS/TOPO nanocrystals expanded on silica glass substrates: Adsorption and desorption effects of polar molecules on nanocrystal surfaces," *J. Luminescence* 119-120, pp. 570-575 (2006).

Oda, M., et al., "Photobrightening of CdSe/ZnS/TOPO Nanocrystals", *ScienceDirect, J. of Luminescence*, vol. 122-123 (2007), pp. 762-765.

Oda, M., et al., "Photoluminescence behaviors of single CdSe/ZnS/TOPO nanocrystals: Adsorption effects of water molecules onto nanocrystal surfaces", *J. Luminescence* (2007) vol. 127, pp. 198-203.

Oertel, D.C., et al., "Photodetectors based on treated CdSe quantum-dot films", Appl. Phys. Lett. 87, 213505 (2005).

(56) References Cited

OTHER PUBLICATIONS

PCT Search Report and Written Opinion dated Feb. 1, 2011 for International Application No. PCT/US2010/056397 of which this application is a continuation.
Pechstedt, et al., "Photoluminescence of Colloidal CdSe/ZnS Quantum Dots: The Critical Effect of Water Molecules", *J. Phys. Chem. C* (2010), vol. 114, pp. 12069-12077.
Peterson, J. J. et al., "Photobrightening and photodarkening in PbS quantum dots", *Phys. Chem. Chem. Phys.*, (2006), pp. 3851-3856.
Polyakov, et al. "Some aspects of pulsed laser deposition of Si nanocrystalline films", *Eur. Phys. J. Appl. Phys.*, vol. 48, 20502 pp. 1-5 (2009).
Schlamp, et al., "Improved efficiencies in light emitting diodes made with CdSe(CdS) core/shell type nanocrystals and a semiconducting polymer", *J. Appl. Phys.* 82, pp. 5837-5842 (1997).
Sharma, S.C. "A review of the electro-optical properties and their modification by radiation in polymer-dispersed liquid crystals and thin films containing CdSe/ZnS quantum dots", *Materials Science and Engineering B*, vol. 168 (2010), pp. 5-15.
Shen, Y-J, et al., "Assembly of CdS quantum dots onto mesoscopic $TiO_2$ films for quantum dot-sensitized solar cell applications", Nanotechnology 19 (2008) 045602 (7pp).
Shim, et al., "Doping and Charging in Colloidal Semiconductor Nanocrystals", MRS Bulletin/Dec. 2001, pp. 1005-1008.
Sun, et al., "Bright multicoloured light-emitting diodes based on quantum dots," *Nature Photonics* 1, pp. 717-722 (2007).
Talapin, D.V., et al., "Prospects of Colloidal Nanocrystals for Electronic and Optoelectronic Applications", Chem. Rev. 2010, 110, 389-458.
Tsay, J.M., et al., "Enhancing the Photoluminescence of Peptide-Coated Nanocrystals with Shell Composition and UV Irradiation", J PHys Chem B. Feb. 10, 2005; 109(5): 1669-1674.
Wada, et al., "Photoinduced Film Formation of Colloidal CdSe Quantum Dots", J. Phys. Chem. C, vol. 112, pp. 17109-17114 (2008).
White, et al., "Inverted bulk-heterojunction organic photovoltaic device using a solution-derived ZnO underlayer," *App. Phys. Lett.* 89; pp. 143517-143519 (2006).
Woo, W-K., et al., "Reversible Charging of CdSe Nanocrystals in a Simple Solid-State Device", *Advanced Materials* vol. 14, No. 15, pp. 1068-1071 (2002).
Wood, et al., "Selection of Metal Oxide Charge Transport Layers for Colloidal Quantum Dot LEDs", *ACS Nano* (2009) vol. 3 (11), pp. 3581-3586.
Xie, et al., "Synthesis and Characterization of Highly Luminescent CdSe-Core $CdS/Zn_{0.5}Cd_{0.5}S/ZnS$ Multishell Nanocrystals," *J. Am. Chem. Soc.* 127, pp. 7480-7488 (2005).
Yuan, C.T. et al., "Photoinduced Fluorescence enhancement in colloidal CdSeTe/Zns core/shell quantum dots", *Applied Physics Letters* 92, (2008), 183108,1-3.

\* cited by examiner

QLED device structure, proposed energy diagram and functioning device

Time dependence of QD thin film PL under blue light illumination (λ = 450 nm) in dry and wet N2 atmosphere.

DEVICE INCLUDING QUANTUM DOTS

This application is a continuation of U.S. application Ser. No. 13/468,199 filed 10 May 2012, which is a continuation of commonly owned International Application No. PCT/US2010/056397 filed 11 Nov. 2010, which was published in the English language as PCT Publication No. WO 2011/060180 A1 on 19 May 2011, which International Application claims priority to U.S. Application No. 61/260,388 filed 11 Nov. 2009; U.S. Application No. 61/262,501 filed 18 Nov. 2009; U.S. Application No. 61/377,242 filed 26 Aug. 2010; U.S. Application No. 61/377,125 filed 26 Aug. 2010; and U.S. Application No. 61/377,148 filed 26 Aug. 2010. Each of the foregoing is hereby incorporated herein by reference in its entirety.

FEDERALLY SPONSORED RESEARCH OR DEVELOPMENT

This invention was made with Government support under Advanced Technology Program Award No. 70NANB7H7056 awarded by NIST. The United States has certain rights in the invention.

TECHNICAL FIELD OF THE INVENTION

The present invention relates to the technical field of devices including quantum dots.

SUMMARY OF THE INVENTION

In accordance with one aspect of the present invention, there is provided a method of making a device comprising forming a layer comprising quantum dots over a substrate including a first electrode, fixing the layer comprising quantum dots formed over the substrate, and exposing at least a portion of, and preferably all, exposed surfaces of the fixed layer comprising quantum dots to small molecules.

In certain preferred embodiments, the layer comprising quantum dots is fixed in the substantial absence of oxygen.

In certain preferred embodiments, the layer comprising quantum dots is fixed in the absence of oxygen.

In certain embodiments, a small molecule includes no more than 50 atoms.

In certain embodiments, a small molecule includes no more than 30 atoms.

In certain embodiments, a small molecule includes no more than 20 atoms.

In certain embodiments, a small molecule includes no more than 10 atoms.

In certain embodiments, a small molecule includes no more than 5 atoms.

A small molecule can have a molecular weight of less than or equal to 100 a.m.u.

Preferably a small molecule comprises a small polar molecule.

In certain embodiments, a small polar molecule comprises water.

In certain embodiments, a small polar molecule comprises a $C_1$-$C_3$ alcohol.

In certain embodiments, a small polar molecule comprises hydrogen sulfide.

In certain embodiments, a small polar molecule comprises phenol.

In certain embodiments, a small polar molecule comprises hydrazine.

In certain embodiments, a small polar molecule comprises arsine.

In certain embodiments, a small polar molecule comprises phosphine.

In certain embodiments, a small polar molecule comprises ammonia.

In certain embodiments, a small polar molecule comprises ammonium hydroxide.

In certain embodiments, a small polar molecule comprises hydrogen fluoride.

In certain embodiments, a small polar molecule comprises hydrogen chloride.

In certain embodiments, a small polar molecule comprises hydrogen bromide.

In certain embodiments, a small polar molecule comprises hydrogen iodide.

In certain embodiments, a small polar molecule comprises methanol.

In certain embodiments, a small polar molecule comprises ethanol.

In certain embodiments, a small polar molecule comprises a $C_1$-$C_3$ thiol.

In certain embodiments, a small molecule comprises a mixture of two or more different small molecules.

In certain embodiments, the small molecules are in gaseous state.

In certain embodiments, the small molecules are in liquid state.

In certain embodiments, the small molecules are included in a carrier gas.

In certain embodiments, the small molecules are included in a carrier liquid.

Mixtures including small molecules can also be used.

A small molecule can be in the form of a gas and/or liquid that can be further dispersed in a carrier gas or liquid.

In certain embodiments a small molecule can be included in a mist, vapor, spray, gas flow stream, etc.

In certain embodiments, a small polar molecule comprises a mixture comprising an inorganic salt (e.g., without limitation, sodium chloride) and water.

In certain embodiments, a small molecule includes a lone electron pair.

Other small molecules can be useful or desirable.

In certain embodiments, exposure to small molecules is carried out in air.

In certain embodiments, exposure to small molecules is carried out in the substantial absence of oxygen.

In certain embodiments, exposure to small molecules is carried out in the absence of oxygen.

In certain embodiments, exposure to small molecules is carried out in nitrogen.

In certain embodiments, exposure to small molecules is carried out in argon.

In certain embodiments, exposure to small molecules is carried out at a temperature in a range from about 20° to about 80° C.

In certain embodiments, exposure to small molecules is carried out at a temperature in a range from about 20° to about 80° C. in air.

In certain embodiments, exposure to small molecules is carried out at a temperature in a range from about 20° to about 80° C. in the substantial absence of oxygen.

In certain embodiments, exposure to small molecules is carried out at a temperature in a range from about 20° to about 80° C. in the absence of oxygen.

In certain embodiments, exposure to small molecules is carried out at a temperature in a range from about 20° to about 80° C. in argon.

In certain embodiments, exposure to small molecules is carried out at a temperature in a range from about 20° to about 80° C. in nitrogen.

In certain embodiments, exposure to small molecules is carried out at a temperature of about 25° C.

In certain embodiments, exposure to small molecules is carried out at room temperature.

In certain embodiments, exposure to small molecules is carried out at a pressure of about 1 atmosphere.

In certain embodiments, exposure to small molecules is carried out at a pressure of less than 1 atmosphere.

In certain embodiments, exposure to small molecules is carried out at a pressure of greater than about 1 atmosphere.

Other pressures may be desirable or useful.

In certain embodiments, all or a portion of the exposed surfaces of the fixed layer comprising quantum dots is exposed to small molecules for at least about 30 seconds.

In certain embodiments, all or a portion of the exposed surfaces of the fixed layer comprising quantum dots is exposed to small molecules for at least about 1 minute.

In certain embodiments, all or a portion of the exposed surfaces of the fixed layer comprising quantum dots is exposed to small molecules for at least about 5 minutes.

In certain embodiments, all or a portion of the exposed surfaces of the fixed layer comprising quantum dots is exposed to small molecules for at least about 15 minutes.

Other times may be determined to be useful or desirable.

In certain embodiments, all or a portion of the exposed surfaces of the fixed layer comprising quantum dots is exposed to small molecules for a predetermined period of time.

In certain embodiments, exposing all or a portion of the exposed surfaces of the fixed layer comprising quantum dots to small molecules comprises exposing all or a portion of exposed surfaces of the fixed layer formed over the substrate to an environment including small molecules that are in a gaseous state.

In certain embodiments, exposing all or a portion of the exposed surfaces of the fixed layer comprising quantum dots formed over the substrate to small molecules comprises exposing all or a portion of the exposed surfaces of the fixed layer comprising quantum dots formed over the substrate to an environment including small molecules that are in a liquid state.

In certain embodiments, the partial device including the fixed layer comprising quantum dots can be dipped in a liquid comprising a small molecule. In certain embodiments, the partial device including the fixed layer comprising quantum dots can be soaked in a liquid comprising a small molecule. In certain embodiments, a liquid comprising a small molecule can be contacted with all or a portion of the exposed surfaces of the layer comprising quantum dots. For example, a liquid comprising a small molecule can be poured over all or a portion of the exposed surfaces of the fixed layer comprising quantum dots; all or a portion of the exposed surfaces of the fixed layer comprising quantum dots can be sprayed with a liquid comprising a small molecule.

Other techniques for exposing small molecules to all or a portion of exposed surfaces of the layer comprising quantum dots can be useful or desirable.

In certain embodiments, fixing the layer comprising quantum dots comprises heating the partial device including the layer comprising quantum dots formed over the substrate, preferably in an oxygen free atmosphere. In certain embodiments, the partial device is heated at a temperature in a range from about 80° C. to about 180° C. In certain embodiments, heating is carried out in vacuum. In certain embodiments, the fixing step is carried out in nitrogen. In certain embodiments, the fixing step is carried out in argon.

In certain embodiments, fixing the layer comprising quantum dots comprises subjecting the partial device including the layer comprising quantum dots formed over the substrate to vacuum evaporation, preferably in an oxygen free atmosphere. In certain of such embodiments, the partial device is further heated at a temperature in a range from about 80° C. to about 180° C. In certain embodiments, the fixing step is carried out in nitrogen. In certain embodiments, the fixing step is carried out in argon.

In certain embodiments, the method further comprises arranging a second electrode over the layer comprising quantum dots after exposure to small molecules.

In certain embodiments, the method further comprises including one or more additional layers in the device before including the second electrode.

In certain embodiments, the method further comprises forming a first layer comprising a material capable of transporting charge over the substrate including the first electrode prior to forming the layer comprising quantum dots.

In certain embodiments, the method further comprises forming a first layer comprising a material capable of transporting charge over the layer comprising quantum dots after exposure to small molecules.

In certain embodiments, the method further comprises forming a first layer comprising a material capable of transporting charge over the substrate including the first electrode prior to forming the layer comprising quantum dots, and forming a second layer comprising a material capable of transporting charge over the layer comprising quantum dots after exposure to small molecules.

In certain embodiments, the method further includes formation of additional layers.

In certain embodiments, the partial device is placed in an oxygen free atmosphere under vacuum of $10^{-6}$ or higher after exposure and prior to further processing.

In certain embodiments, method steps further included after the small molecule exposure step are performed in the substantial absence of oxygen.

In certain embodiments, method steps further included after the small molecule exposure step are performed in absence of oxygen.

In certain embodiments, the method further includes encapsulating a finished device in the substantial absence of oxygen. Preferably encapsulating is carried out in the absence of oxygen.

In certain embodiments, the layer comprising quantum dots that is formed has a thickness up to about 100 nm.

In certain embodiments, the layer comprising quantum dots that is formed has a thickness of about 20 to about 30 nm.

In certain embodiments, the layer comprising quantum dots is a neat film.

In certain embodiments, the layer comprising quantum dots can comprise a matrix material in which the quantum dots are distributed. Such matrix materials can be readily ascertained by the skilled artisan.

In certain embodiments, forming the layer comprising quantum dots comprises applying an ink comprising quantum dots and a carrier liquid and removing the carrier liquid.

In certain embodiments, forming the layer comprising quantum dots comprises applying an ink comprising quantum dots and a carrier liquid and evaporating the carrier liquid.

In certain embodiments, forming the layer comprising quantum dots comprises applying an ink comprising quantum dots and a carrier liquid and evaporating the carrier liquid by vacuum evaporation. In certain of such embodiments, after evaporation of the liquid carrier, the layer comprising quantum dots are heated in the substantial absence of oxygen to remove carrier liquid. Such heating can be carried out in the absence of oxygen.

In certain embodiments, the device comprises a light emitting device.

In certain embodiments, the device comprises a photovoltaic device.

In certain embodiments, the device comprises a photodetector.

In certain embodiments, the device comprises a transistor.

In certain embodiments, the device comprises a memory device.

In certain embodiments, the quantum dots comprise semiconductor nanocrystals.

In certain embodiments, the quantum dots comprise a core comprising a first semiconductor material and a shell over at least a portion of an outer surface of the core, the shell comprising a second semiconductor material.

In certain embodiments, one or more ligands are attached to an outer surface of at least a portion of the quantum dot.

In certain embodiments, ligands include one or more aliphatic groups, which can be independently substituted or unsubstituted.

In certain embodiments, ligands include one or more aromatic groups, which can be independently substituted or unsubstituted.

In certain embodiments, the layer comprising quantum dots is formed over a predetermined area of the substrate.

In certain embodiments, the layer comprising quantum dots is patterned.

In certain embodiments, the layer comprising quantum dots is unpatterned.

In certain embodiments, the layer comprising quantum dots includes two or more different types of quantum dots. In certain of such embodiments, the different types of quantum dots emit light at a predetermined wavelength which is preferably distinct from that emitted by at least one of the other types included in the layer.

In certain embodiments, the method further comprises exposing at least a portion of, and preferably all, exposed surfaces of the layer comprising quantum dots to light flux while at least a portion of, and preferably all, exposed surfaces of the layer is in contact with small molecules.

In certain embodiments, the method can include exposing at least a portion of, and preferably all, exposed surfaces of the layer comprising quantum dots to light flux prior to small molecule exposure.

In certain embodiments, the light flux includes a peak emission wavelength that can excite at least a portion of the quantum dots.

In certain embodiments, the light flux includes a peak emission wavelength in a range from about 365 nm to about 480 nm.

In certain embodiments, the light flux includes a peak emission wavelength in a range from about 400 nm to about 480 nm.

In certain embodiments, the light flux includes a peak emission wavelength in a range from about 450 nm to about 470 nm.

In certain embodiments, the light flux is provided by a light source with peak wavelength of about 470 nm.

In certain embodiments, the light flux is from about 10 to about 100 mW/cm$^2$.

In certain embodiments, the light flux is about 30 mW/cm$^2$.

In accordance with another aspect of the invention, there is provided a device obtainable by the above method for making a device.

In certain embodiments, the device comprises a light emitting device.

In certain embodiments, the device comprises a photovoltaic device.

In certain embodiments, the device comprises a photodetector.

In certain embodiments, the device comprises a transistor.

In certain embodiments, the device comprises a memory device.

In accordance with another aspect of the present invention, there is provided a method of making a device comprising forming a layer comprising quantum dots over a substrate including a first electrode, and exposing at least a portion, and preferably all, of the exposed surfaces of the layer comprising quantum dots to small molecules and light flux.

In certain embodiments, a small molecule includes no more than 50 atoms.

In certain embodiments, a small molecule includes no more than 30 atoms.

In certain embodiments, a small molecule includes no more than 20 atoms.

In certain embodiments, a small molecule includes no more than 10 atoms.

In certain embodiments, a small molecule includes no more than 5 atoms.

A small molecule can have a molecular weight of less than or equal to 100 a.m.u.

Preferably a small molecule comprises a small polar molecule.

Examples of small polar molecules include those described above and elsewhere herein.

In certain embodiments, a small molecule comprises a mixture of two or more different small molecules.

In certain embodiments, the small molecules are in gaseous state.

In certain embodiments, the small molecules are in liquid state.

In certain embodiments, the small molecules are included in a carrier gas.

In certain embodiments, the small molecules are included in a carrier liquid.

Mixtures including small molecules can also be used.

A small molecule can be in the form of a gas and/or liquid that can be further dispersed in a carrier gas or liquid.

In certain embodiments a small molecule can be included in a mist, vapor, spray, gas flow stream, etc.

In certain embodiments, a small polar molecule comprises a mixture comprising an inorganic salt (e.g., without limitation, sodium chloride) and water.

In certain embodiments, a small molecule includes a lone electron pair.

Other small molecules can be useful or desirable.

In certain embodiments, exposure to small molecules and light flux is carried out in air.

In certain embodiments, exposure to small molecules and light flux is carried out in the substantial absence of oxygen.

In certain embodiments, exposure to small molecules and light flux is carried out in the absence of oxygen.

In certain embodiments, exposure to small molecules and light flux is carried out in nitrogen.

In certain embodiments, exposure to small molecules and light flux is carried out in argon.

In certain embodiments, exposure to small molecules and light flux is carried out at a temperature in a range from about 20° to about 80° C.

In certain embodiments, exposure to small molecules and light flux is carried out at a temperature in a range from about 20° to about 80° C. in air.

In certain embodiments, exposure to small molecules and light flux is carried out at a temperature in a range from about 20° to about 80° C. in the substantial absence of oxygen.

In certain embodiments, exposure to small molecules and light flux is carried out at a temperature in a range from about 20° to about 80° C. in the absence of oxygen.

In certain embodiments, exposure to small molecules and light flux is carried out at a temperature in a range from about 20° to about 80° C. in argon.

In certain embodiments, exposure to small molecules and light flux is carried out at a temperature in a range from about 20° to about 80° C. in nitrogen.

In certain embodiments, exposure to small molecules and light flux is carried out at a temperature of about 25° C.

In certain embodiments, exposure to small molecules and light flux is carried out at room temperature.

In certain embodiments, exposure to small molecules and light flux is carried out at a pressure of about 1 atmosphere.

In certain embodiments, exposure to small molecules and light flux is carried out at a pressure of less than 1 atmosphere.

In certain embodiments exposure to small molecules and light flux is carried out at a pressure of greater than about 1 atmosphere.

Other pressures may be desirable or useful.

In certain embodiments, exposing all or a portion of the exposed surfaces of the layer comprising quantum dots formed over a substrate to small molecules comprises exposing all or a portion of the exposed surfaces of the layer comprising quantum dots formed over a substrate to an environment including the small molecules that are in a gaseous state.

In certain embodiments, exposing all or a portion of the exposed surfaces of the layer comprising quantum dots formed over a substrate comprises exposing all or a portion of the exposed surfaces of the layer comprising quantum dots formed over a substrate to an environment including the small molecules that are in a liquid state.

In certain embodiments, the partial device including the layer comprising quantum dots can be dipped in a liquid comprising a small molecule.

In certain embodiments, the partial device including the layer comprising quantum dots can be soaked in a liquid comprising a small molecule.

In certain embodiments, a liquid comprising a small molecule can be contacted with all or a portion of the exposed surfaces of the layer comprising quantum dots. For example, a liquid comprising a small molecule can be poured over all or a portion of the exposed surfaces of the layer comprising quantum dots; all or a portion of the exposed surfaces of the layer comprising quantum dots can be sprayed with a liquid comprising a small molecule.

Other techniques for exposing small molecules to all or a portion of exposed surfaces of the layer comprising quantum dots can be useful or desirable.

In certain embodiments, the light flux includes a peak emission wavelength that can excite at least a portion of the quantum dots.

In certain embodiments, the light flux includes a peak emission wavelength in a range from about 365 nm to about 480 nm.

In certain embodiments, the light flux includes a peak emission wavelength in a range from about 400 nm to about 480 nm.

In certain embodiments, the light flux includes a peak emission wavelength in a range from about 450 nm to about 470 nm.

In certain embodiments, the light flux is provided by a light source with peak wavelength of about 470 nm.

In certain embodiments, the light flux is from about 10 to about 100 mW/cm$^2$.

In certain embodiments, the light flux is about 30 mW/cm$^2$.

In certain embodiments, at least a portion of, and preferably all, exposed surfaces of the layer comprising quantum dots is exposed to small molecules and light flux for at least about 30 seconds. In certain embodiments, at least a portion of, and preferably all, exposed surfaces of the layer comprising quantum dots is simultaneously exposed to small molecules and light flux for at least about 30 seconds.

In certain embodiments, at least a portion of, and preferably all, exposed surfaces of the layer comprising quantum dots is exposed to small molecules and light flux for at least about 1 minute. In certain embodiments, at least a portion of, and preferably all, exposed surfaces of the layer comprising quantum dots is simultaneously exposed to small molecules and light flux for at least about 1 minute.

In certain embodiments, at least a portion of, and preferably all, exposed surfaces of the layer comprising quantum dots is exposed to small molecules and light flux for at least about 5 minutes. In certain embodiments, at least a portion of, and preferably all, exposed surfaces of the layer comprising quantum dots is simultaneously exposed to small molecules and light flux for at least about 5 minutes.

In certain embodiments, at least a portion of, and preferably all, exposed surfaces of the layer comprising quantum dots is exposed to small molecules and light flux for at least about 15 minutes. In certain embodiments, at least a portion of, and preferably all, exposed surfaces of the layer comprising quantum dots is simultaneously exposed to small molecules and light flux for at least about 15 minutes.

Other times may be determined to be useful or desirable.

In certain embodiments, at least a portion of, and preferably all, exposed surfaces of the layer comprising quantum dots is exposed to small molecules for a first predetermined period of time and to light flux for a second predetermined period of time which can be the same or different from the first.

In certain embodiments, at least a portion of, and preferably all, exposed surfaces of the layer comprising quantum dots is simultaneously exposed to small molecules and light flux for a predetermined period of time.

In certain embodiments, all or a portion of exposed surfaces of the layer comprising quantum dots can be exposed to small molecules and at least a portion of, and preferably all, of the exposed surfaces of the layer are then exposed to light flux while all or a portion of the layer comprising quantum dots is in contact with small molecules.

In certain embodiments, all or a portion of exposed surfaces of the layer comprising quantum dots can be exposed to light flux at least a portion of the time while all or a portion of exposed surfaces of the layer comprising quantum dots is being exposed to small molecules. In certain of such embodiments, exposure to light flux can continue after exposure to small molecules is stopped. In certain of such embodiments, exposure to small molecules can continue after exposure to light flux is stopped.

In certain embodiments, at least a portion of, and preferably all, exposed surfaces of the layer comprising quantum dots is exposed to small molecules prior to exposure to light flux.

In certain embodiments, at least a portion of, and preferably all, exposed surfaces of the layer comprising quantum dots can be exposed to small molecules after exposure to light flux.

In certain embodiments, the method further comprises arranging a second electrode over the layer comprising quantum dots after exposure to small molecules and light flux.

In certain embodiments, the method further comprises including one or more additional layers in the device before including the second electrode.

In certain embodiments, the method further comprises forming a first layer comprising a material capable of transporting charge over the substrate including the first electrode prior to forming the layer comprising quantum dots.

In certain embodiments, the method further comprises forming a first layer comprising a material capable of transporting charge over the layer comprising quantum dots after exposure to small molecules and light flux.

In certain embodiments, the method further comprises forming a first layer comprising a material capable of transporting charge over the substrate including the first electrode prior to forming the layer comprising quantum dots, and forming a second layer comprising a material capable of transporting charge over the layer comprising quantum dots after exposure to small molecules and light flux.

In certain embodiments, the partial device is placed in an oxygen free atmosphere under vacuum of $10^{-6}$ or higher after exposure and prior to further processing.

In certain embodiments, the method further includes formation of additional layers.

In certain embodiments, method steps further included after the exposure step are performed in substantial absence of oxygen.

In certain embodiments, method steps further included after the exposure step are performed in absence of oxygen.

In certain embodiments, the method further includes encapsulating a finished device in substantial absence of oxygen. Preferably, encapsulation is carried out in the absence of oxygen.

In certain embodiments, the layer comprising quantum dots that is formed has a thickness up to about 100 nm.

In certain embodiments, the layer comprising quantum dots that is formed has a thickness of about 20 to about 30 nm.

In certain embodiments, the layer comprising quantum dots is a neat film.

In certain embodiments, the layer comprising quantum dots can comprise a matrix material in which the quantum dots are distributed. Such matrix materials can be readily ascertained by the skilled artisan.

In certain embodiments, forming the layer comprising quantum dots comprises applying an ink comprising quantum dots and a carrier liquid and removing the carrier liquid.

In certain embodiments, forming the layer comprising quantum dots comprises applying an ink comprising quantum dots and a carrier liquid and evaporating the carrier liquid.

In certain embodiments, forming the layer comprising quantum dots comprises applying an ink comprising quantum dots and a carrier liquid and evaporating the carrier liquid by vacuum evaporation. In certain of such embodiments, after evaporation of the liquid carrier, the layer comprising quantum dots are heated in substantial absence of oxygen to remove carrier liquid. In certain of such embodiments, after evaporation of the liquid carrier, the layer comprising quantum dots are heated in the absence of oxygen to remove carrier liquid.

In certain embodiments, the device comprises a light emitting device.

In certain embodiments, the device comprises a photovoltaic device.

In certain embodiments, the device comprises a photodetector.

In certain embodiments, the device comprises a transistor.

In certain embodiments, the device comprises a memory device.

In certain embodiments, the quantum dots comprise semiconductor nanocrystals.

In certain embodiments, the quantum dots comprise a core comprising a first semiconductor material and a shell over at least a portion of an outer surface of the core, the shell comprising a second semiconductor material.

In certain embodiments, one or more ligands are attached to an outer surface of at least a portion of the quantum dot.

In certain embodiments, ligands include one or more aliphatic groups, which can be independently substituted or unsubstituted.

In certain embodiments, ligands include one or more aromatic groups, which can be independently substituted or unsubstituted.

In certain embodiments, the layer comprising quantum dots is formed over a predetermined area of the substrate.

In certain embodiments, the layer comprising quantum dots is patterned.

In certain embodiments, the layer comprising quantum dots is unpatterned.

In certain embodiments, the layer comprising quantum dots includes two or more different types of quantum dots. In certain of such embodiments, the different types of quantum dots emit light at a predetermined wavelength which is preferably distinct from that emitted by at least one of the other types included in the layer.

In certain embodiments, a method of making a device comprises forming a layer comprising quantum dots over a substrate including a first electrode, exposing at least a portion of, and preferably all, exposed surfaces of the layer comprising quantum dots to small molecules; and irradiating at least a portion of, and preferably all, exposed surfaces of the layer comprising quantum dots with light flux while all or a portion of such exposed surfaces is in contact with small molecules. In certain embodiments, the partial device is irradiated with the light flux while the partial device is in an environment including small molecules.

The present methods of making a device can address lifetime and/or performance problems that can occur in a device including quantum dots.

In accordance with another aspect of the invention, there is provided a device obtainable by the above-described method for making a device.

In certain embodiments, the device comprises a light emitting device.

In certain embodiments, the device comprises a photovoltaic device.

In certain embodiments, the device comprises a photodetector.

In certain embodiments, the device comprises a transistor.

In certain embodiments, the device comprises a memory device.

In accordance with another aspect of the present invention, there is provided a method of making a film including a layer comprising quantum dots, the method comprising forming a layer comprising quantum dots over a carrier substrate, fixing the layer comprising quantum dots formed over the carrier substrate, and exposing at least a portion of, and preferably all, exposed surfaces of the fixed layer comprising quantum dots to small molecules.

In preferred certain embodiments, the layer comprising quantum dots is fixed in the substantial absence of oxygen.

In certain preferred embodiments, the layer comprising quantum dots is fixed in the absence of oxygen.

In certain embodiments, a small molecule includes no more than 50 atoms.

In certain embodiments, a small molecule includes no more than 30 atoms.

In certain embodiments, a small molecule includes no more than 20 atoms.

In certain embodiments, a small molecule includes no more than 10 atoms.

In certain embodiments, a small molecule includes no more than 5 atoms.

A small molecule can have a molecular weight of less than or equal to 100 a.m.u.

Preferably a small molecule comprises a small polar molecule.

Examples of small polar molecules include those described above and elsewhere herein.

In certain embodiments, a small molecule comprises a mixture of two or more different small molecules.

In certain embodiments, the small molecules are in gaseous state.

In certain embodiments, the small molecules are in liquid state.

In certain embodiments, the small molecules are included in a carrier gas.

In certain embodiments, the small molecules are included in a carrier liquid.

Mixtures including small molecules can also be used.

A small molecule can be in the form of a gas and/or liquid that can be further dispersed in a carrier gas or liquid.

In certain embodiments a small molecule can be included in a mist, vapor, spray, gas flow stream, etc.

In certain embodiments, a small polar molecule comprises a mixture comprising an inorganic salt (e.g., without limitation, sodium chloride) and water.

In certain embodiments, a small molecule includes a lone electron pair.

Other small molecules can be useful or desirable.

In certain embodiments, exposure to small molecules is carried out in air.

In certain embodiments, exposure to small molecules is carried out in the substantial absence of oxygen.

In certain embodiments, exposure to small molecules is carried out in the absence of oxygen.

In certain embodiments, exposure to small molecules is carried out in nitrogen.

In certain embodiments, exposure to small molecules is carried out in argon.

In certain embodiments, exposure to small molecules is carried out at a temperature in a range from about 20° to about 80° C.

In certain embodiments, exposure to small molecules is carried out at a temperature in a range from about 20° to about 80° C. in air.

In certain embodiments, exposure to small molecules is carried out at a temperature in a range from about 20° to about 80° C. in the substantial absence of oxygen.

In certain embodiments, exposure to small molecules is carried out at a temperature in a range from about 20° to about 80° C. in the absence of oxygen.

In certain embodiments, exposure to small molecules is carried out at a temperature in a range from about 20° to about 80° C. in argon.

In certain embodiments, exposure to small molecules is carried out at a temperature in a range from about 20° to about 80° C. in nitrogen.

In certain embodiments, exposure to small molecules is carried out at a temperature of about 25° C.

In certain embodiments, exposure to small molecules is carried out at room temperature.

In certain embodiments, exposure to small molecules is carried out at a pressure of about 1 atmosphere.

In certain embodiments, the exposure to small molecules is carried out at a pressure of less than 1 atmosphere.

In certain embodiments, exposure to small molecules is carried out at a pressure of greater than about 1 atmosphere.

Other pressures may be desirable or useful.

In certain embodiments, all or a portion of the exposed surfaces of the layer comprising quantum dots is exposed to small molecules for at least about 30 seconds.

In certain embodiments, all or a portion of the exposed surfaces of the layer comprising quantum dots is exposed to small molecules for at least about 1 minute.

In certain embodiments, all or a portion of the exposed surfaces of the layer comprising quantum dots is exposed to small molecules for at least about 5 minutes.

In certain embodiments, all or a portion of the exposed surfaces of the layer comprising quantum dots is exposed to small molecules for at least about 15 minutes.

Other times may be determined to be useful or desirable.

In certain embodiments, all or a portion of the exposed surfaces of the layer comprising quantum dots is exposed to small molecules for a predetermined period of time.

In certain embodiments, exposing all or a portion of the exposed surfaces of the layer comprising quantum dots to small molecules comprises exposing the fixed layer formed over the substrate to an environment including the small molecules that are in a gaseous state.

In certain embodiments, exposing all or a portion of the exposed surfaces of the fixed layer comprising quantum dots formed over the substrate to small molecules comprises exposing all or a portion of the exposed surfaces of the fixed layer comprising quantum dots formed over the substrate to an environment including the small molecules that are in a liquid state.

In certain embodiments, the fixed layer comprising quantum dots formed over the substrate can be dipped in a liquid comprising a small molecule. In certain embodiments, the fixed layer comprising quantum dots formed over the substrate can be soaked in a liquid comprising a small molecule.

In certain embodiments, a liquid comprising a small molecule can be contacted with all or a portion of the exposed surfaces of the fixed layer comprising quantum dots formed over the carrier substrate For example, a liquid comprising a small molecule can be poured over all or a portion of the exposed surfaces of the fixed layer comprising quantum dots; all or a portion of the exposed surfaces of the fixed layer comprising quantum dots can be sprayed with a liquid comprising a small molecule.

Other techniques for exposing small molecules to all or a portion of exposed surfaces of the layer comprising quantum dots can be useful or desirable.

In certain embodiments, fixing the layer comprising quantum dots comprises heating the layer comprising quantum dots formed over the carrier substrate, preferably in an oxygen free atmosphere, In certain embodiments, layer comprising quantum dots formed over the carrier substrate is heated at a temperature in a range from about 80° C. to about 180° C. In certain embodiments, heating is carried out in vacuum. In certain embodiments, the fixing step is carried out in nitrogen. In certain embodiments, the fixing step is carried out in argon.

In certain embodiments, fixing the layer comprising quantum dots comprises subjecting the layer comprising quantum dots formed over the carrier substrate to vacuum evaporation, preferably in an oxygen free atmosphere. In certain of such embodiments, the layer comprising quantum dots formed over the carrier substrate is further heated at a temperature in a range from about 80° C. to about 180° C. In certain embodiments, the fixing step is carried out in nitrogen. In certain embodiments, the fixing step is carried out in argon.

In certain embodiments, the method further comprises forming one or more other layers over the carrier substrate prior to forming the layer comprising quantum dots.

In certain embodiments, the method further comprises forming a one ore more other layers over the fixed layer comprising quantum dots after exposure to small molecules.

In certain embodiments, the layer comprising quantum dots that is formed has a thickness up to about 100 nm.

In certain embodiments, the layer comprising quantum dots that is formed has a thickness of about 20 to about 30 nm.

In certain embodiments, the layer comprising quantum dots is a neat film.

In certain embodiments, the layer comprising quantum dots can comprise a matrix material in which the quantum dots are distributed. Such matrix materials can be readily ascertained by the skilled artisan.

In certain embodiments, forming the layer comprising quantum dots comprises applying an ink comprising quantum dots and a carrier liquid and evaporating the carrier liquid.

In certain embodiments, forming the layer comprising quantum dots comprises applying an ink comprising quantum dots and a carrier liquid and evaporating the carrier liquid by vacuum evaporation. In certain of such embodiments, after evaporation of the liquid carrier, the layer comprising quantum dots are heated in absence of oxygen to remove carrier liquid.

In certain embodiments, the film can be included in a device comprising a light emitting device.

In certain embodiments, the film can be included in a device comprising a photovoltaic device.

In certain embodiments, the film can be included in a device comprising a photodetector.

In certain embodiments, the quantum dots comprise semiconductor nanocrystals.

In certain embodiments, the quantum dots comprise a core comprising a first semiconductor material and a shell over at least a portion of an outer surface of the core, the shell comprising a second semiconductor material.

In certain embodiments, one or more ligands are attached to an outer surface of at least a portion of the quantum dot.

In certain embodiments, ligands include one or more aliphatic groups, which can be independently substituted or unsubstituted.

In certain embodiments, ligands include one or more aromatic groups, which can be independently substituted or unsubstituted.

In certain embodiments, the layer comprising quantum dots is formed over a predetermined area of the substrate.

In certain embodiments, the layer comprising quantum dots is patterned.

In certain embodiments, the layer comprising quantum dots is unpatterned.

In certain embodiments, the layer comprising quantum dots includes two or more different types of quantum dots. In certain of such embodiments, the different types of quantum dots emit light at a predetermined wavelength which is preferably distinct from that emitted by at least one of the other types included in the layer.

In certain embodiments, the method further comprises exposing at least a portion of, and preferably all, exposed surfaces of the layer comprising quantum dots to light flux while at least a portion of, and preferably all, exposed surfaces of the layer is in contact with small molecules.

In certain embodiments, the method can comprise exposing at least a portion of, and preferably all, exposed surfaces of the layer comprising quantum dots to light flux prior to exposing any exposed surfaces of the layer with small molecules.

In certain embodiments, the light flux includes a peak emission wavelength that can excite at least a portion of the quantum dots.

In certain embodiments, the light flux includes a peak emission wavelength in a range from about 365 nm to about 480 nm.

In certain embodiments, the light flux includes a peak emission wavelength in a range from about 400 nm to about 480 nm.

In certain embodiments, the light flux includes a peak emission wavelength in a range from about 450 nm to about 470 nm.

In certain embodiments, the light flux is provided by a light source with peak wavelength of about 470 nm.

In certain embodiments, the light flux is from about 10 to about 100 mW/cm$^2$.

In certain embodiments, the light flux is about 30 mW/cm$^2$.

In certain embodiments, the carrier substrate comprises a tape.

In accordance with another aspect of the invention, there is provided a film obtainable by the above method.

In accordance with another aspect of the present invention, there is provided a method of making a device component including a layer comprising quantum dots, the method comprising forming a layer comprising quantum dots over a layer comprising a charge transport material, and exposing at least a portion, and preferably all, of the exposed surfaces of the layer comprising quantum dots to small molecules and light flux.

In certain embodiments at least a portion, and preferably all, of the exposed surfaces of the layer comprising quantum dots are exposed to small molecules and light flux.

In certain embodiments, a small molecule includes no more than 50 atoms.

In certain embodiments, a small molecule includes no more than 30 atoms.

In certain embodiments, a small molecule includes no more than 20 atoms.

In certain embodiments, a small molecule includes no more than 10 atoms.

In certain embodiments, a small molecule includes no more than 5 atoms.

A small molecule can have a molecular weight of less than or equal to 100 a.m.u.

Preferably a small molecule comprises a small polar molecule.

Examples of small polar molecules include those described above and elsewhere herein.

In certain embodiments, a small molecule comprises a mixture of two or more different small molecules.

In certain embodiments, the small molecules are in gaseous state.

In certain embodiments, the small molecules are in liquid state.

In certain embodiments, the small molecules are included in a carrier gas.

In certain embodiments, the small molecules are included in a carrier liquid.

Mixtures including small molecules can also be used.

A small molecule can be in the form of a gas and/or liquid that can be further dispersed in a carrier gas or liquid.

In certain embodiments a small molecule can be included in a mist, vapor, spray, gas flow stream, etc.

In certain embodiments, a small polar molecule comprises a mixture comprising an inorganic salt (e.g., without limitation, sodium chloride) and water.

In certain embodiments, a small molecule includes a lone electron pair.

Other small molecules can be useful or desirable.

In certain embodiments, exposure to small molecules and light flux step is carried out in air.

In certain embodiments, exposure to small molecules and light flux is carried out in the substantial absence of oxygen.

In certain embodiments, exposure to small molecules and light flux is carried out in the absence of oxygen.

In certain embodiments exposure to small molecules and light flux is carried out in nitrogen.

In certain embodiments, exposure to small molecules and light flux is carried out in argon.

In certain embodiments, exposure to small molecules and light flux is carried out at a temperature in a range from about 20° to about 80° C.

In certain embodiments, exposure to small molecules and light flux is carried out at a temperature in a range from about 20° to about 80° C. in air.

In certain embodiments, exposure to small molecules and light flux is carried out at a temperature in a range from about 20° to about 80° C. in the substantial absence of oxygen.

In certain embodiments, exposure to small molecules and light flux is carried out at a temperature in a range from about 20° to about 80° C. in the absence of oxygen.

In certain embodiments, exposure to small molecules and light flux is carried out at a temperature in a range from about 20° to about 80° C. in argon.

In certain embodiments, exposure to small molecules and light flux is carried out at a temperature in a range from about 20° to about 80° C. in nitrogen.

In certain embodiments, exposure to small molecules is carried out at a temperature of about 25° C.

In certain embodiments, exposure to small molecules and light flux is carried out at room temperature.

In certain embodiments, exposure to small molecules and light flux is carried out at a pressure of about 1 atmosphere.

In certain embodiments, exposure to small molecules and light flux is carried out at a pressure of less than 1 atmosphere.

In certain embodiments exposure to small molecules and light flux is carried out at a pressure of greater than about 1 atmosphere.

Other pressures may be desirable or useful.

In certain embodiments, the light flux includes a peak emission wavelength that can excite at least a portion of the quantum dots.

In certain embodiments, the light flux includes a peak emission wavelength in a range from about 365 nm to about 480 nm.

In certain embodiments, the light flux includes a peak emission wavelength in a range from about 400 nm to about 480 nm.

In certain embodiments, the light flux includes a peak emission wavelength in a range from about 450 nm to about 470 nm.

In certain embodiments, the light flux is provided by a light source with peak wavelength of about 470 nm.

In certain embodiments, the light flux is from about 10 to about 100 mW/cm$^2$.

In certain embodiments, the light flux is about 30 mW/cm$^2$.

In certain embodiments, all or a portion of the exposed surfaces of the layer comprising quantum dots is exposed to small molecules and light flux for at least about 30 seconds. In certain embodiments, at least a portion of, and preferably all, exposed surfaces of the layer comprising quantum dots is simultaneously exposed to small molecules and the light flux for at least about 30 seconds.

In certain embodiments, all or a portion of the exposed surfaces of the layer comprising quantum dots is exposed to small molecules and light flux for at least about 1 minute. In certain embodiments, at least a portion of, and preferably all, exposed surfaces of the layer comprising quantum dots is simultaneously exposed to small molecules and the light flux for at least about 1 minute.

In certain embodiments, all or a portion of the exposed surfaces of the layer comprising quantum dots is exposed to small molecules and light flux for at least about 5 minutes. In certain embodiments, at least a portion of, and preferably all, exposed surfaces of the layer comprising quantum dots is simultaneously exposed to small molecules and the light flux for at least about 5 minutes.

In certain embodiments, all or a portion of the exposed surfaces of the layer comprising quantum dots is exposed to small molecules and light flux for at least about 15 minutes. In certain embodiments, at least a portion of, and preferably all, exposed surfaces of the layer comprising quantum dots is simultaneously exposed to small molecules and the light flux for at least about 15 minutes.

Other times may be determined to be useful or desirable.

In certain embodiments, at least a portion of, and preferably all, exposed surfaces of the layer comprising quantum dots is exposed to small molecules for a first predetermined period of time and to light flux for a second predetermined period of time which can be the same or different from the first.

In certain embodiments, at least a portion of, and preferably all, exposed surfaces of the layer comprising quantum dots is simultaneously exposed to small molecules and the light flux for a predetermined period of time.

In certain embodiments, all or a portion of exposed surfaces of the layer comprising quantum dots can be exposed to small molecules and at least a portion of, and preferably all, of the exposed surfaces of the layer are then exposed to light flux while all or a portion of the layer comprising quantum dots is in contact with small molecules.

In certain embodiments, all or a portion of exposed surfaces of the layer comprising quantum dots can be exposed to light flux at least a portion of the time while all or a portion of exposed surfaces of the layer comprising quantum dots is being exposed to small molecules. In certain of such embodiments, exposure to light flux can continue after exposure to small molecules is stopped. In certain of such embodiments, exposure to small molecules can continue after exposure to light flux is stopped.

In certain embodiments, at least a portion of, and preferably all, exposed surfaces of the layer comprising quantum dots is exposed to small molecules prior to exposure to light flux.

In certain embodiments, at least a portion of, and preferably all, exposed surfaces of the layer comprising quantum dots can be exposed to small molecules after exposure to light flux.

In certain embodiments, the method further comprises forming one or more other layers over the layer comprising a charge transport material prior to forming the layer comprising quantum dots.

In certain embodiments, the method further comprises forming a one ore more other layers over the layer comprising quantum dots after exposure to small molecules and light flux.

In certain embodiments, method steps following exposure to small molecules and light flux are carried out in the substantial absence of oxygen.

In certain embodiments, method steps following exposure to small molecules and light flux are carried out in absence of oxygen.

In certain embodiments, exposing all or a portion of the exposed surfaces of the layer comprising quantum dots formed over the layer comprising a charge transport material to small molecules comprises exposing all or a portion of the exposed surfaces of the layer comprising quantum dots formed over the layer comprising a charge transport material to an environment including the small molecules that are in a gaseous state.

In certain embodiments, exposing all or a portion of the exposed surfaces of the layer comprising quantum dots formed over the layer comprising a charge transport material comprises exposing all or a portion of the exposed surfaces of the layer comprising quantum dots formed over the layer comprising a charge transport material to an environment including the small molecules that are in a liquid state.

In certain embodiments, the layer comprising quantum dots formed over the layer comprising a charge transport material can be dipped in a liquid comprising a small molecule. In certain embodiments, layer comprising quantum dots formed over the layer comprising a charge transport material can be soaked in a liquid comprising a small molecule.

In certain of such embodiments, a liquid comprising a small molecule can be contacted with all or a portion of the exposed surfaces of the layer comprising quantum dots formed over the layer comprising a charge transport material. For example, a liquid comprising a small molecule can be poured over all or a portion of the exposed surfaces of the layer comprising quantum dots; all or a portion of the exposed surfaces of the layer comprising quantum dots can be sprayed with a liquid comprising a small molecule, etc.

Other techniques for exposing small molecules to all or a portion of exposed surfaces of the layer comprising quantum dots can be useful or desirable.

In certain embodiments, the layer comprising quantum dots that is formed has a thickness up to about 100 nm.

In certain embodiments, the layer comprising quantum dots that is formed has a thickness of about 20 to about 30 nm.

In certain embodiments, the layer comprising quantum dots is a neat film.

In certain embodiments, the layer comprising quantum dots can comprise a matrix material in which the quantum dots are distributed. Such matrix materials can be readily ascertained by the skilled artisan.

In certain embodiments, forming the layer comprising quantum dots comprises applying an ink comprising quantum dots and a carrier liquid and removing the carrier liquid.

In certain embodiments, forming the layer comprising quantum dots comprises applying an ink comprising quantum dots and a carrier liquid and evaporating the carrier liquid.

In certain embodiments, forming the layer comprising quantum dots comprises applying an ink comprising quantum dots and a carrier liquid and evaporating the carrier liquid by vacuum evaporation. In certain of such embodiments, after evaporation of the liquid carrier, the layer comprising quantum dots are heated in absence of oxygen to remove carrier liquid.

In certain embodiments, the device component can be included in a device comprising a light emitting device.

In certain embodiments, the device component can be included in a device comprising a photovoltaic device.

In certain embodiments, the device component can be included in a device comprising a photodetector.

In certain embodiments, the device component can be included in a device comprising a transistor.

In certain embodiments, the device component can be included in a device comprising a memory device.

In certain embodiments, the quantum dots comprise semiconductor nanocrystals.

In certain embodiments, the quantum dots comprise a core comprising a first semiconductor material and a shell over at least a portion of an outer surface of the core, the shell comprising a second semiconductor material.

In certain embodiments, one or more ligands are attached to an outer surface of at least a portion of the quantum dot.

In certain embodiments, ligands include one or more aliphatic groups, which can be independently substituted or unsubstituted.

In certain embodiments, ligands include one or more aromatic groups, which can be independently substituted or unsubstituted.

In certain embodiments, the layer comprising quantum dots is formed over a predetermined area of the substrate.

In certain embodiments, the layer comprising quantum dots is patterned.

In certain embodiments, the layer comprising quantum dots is unpatterned.

In certain embodiments, the layer comprising quantum dots includes two or more different types of quantum dots. In certain of such embodiments, the different types of quantum dots emit light at a predetermined wavelength which is preferably distinct from that emitted by at least one of the other types included in the layer.

In certain embodiments, a method of making a device component comprising quantum dots comprises forming a layer comprising quantum dots over a layer comprising a charge transport material, exposing at least a portion of, and preferably all, exposed surfaces of the layer comprising quantum dots to small molecules; and irradiating at least a portion of, and preferably all, exposed surfaces of the layer comprising quantum dots with light flux while all or a portion of such exposed surfaces is in contact with small molecules. In certain embodiments, irradiation with the light flux is carried out while the layer comprising quantum dots over a layer comprising a charge transport material is in an environment including small molecules.

In certain embodiments, the device component can be formed on a carrier substrate.

In accordance with another aspect of the invention, there is provided a device component obtainable by the method described herein for making a device component.

The present methods of making a film, device and device component can address lifetime and/or performance problems that can occur with use of quantum dots in devices.

In accordance with one aspect of the present invention, there is provided a method for improving at least one performance attribute of a device including a layer comprising quantum dots, the method comprising a method for making a device described herein.

In certain embodiments, the performance attribute comprises the external quantum efficiency of the device.

In certain embodiments, the performance attribute comprises the lifetime of the device.

In certain embodiments, the performance attributes comprises the lifetime and external quantum efficiency of the device.

In accordance with another aspect of the present invention, there is provided a device including a first electrode, a second electrode, and a layer comprising quantum dots disposed between the electrodes, wherein the layer comprising quantum dots is disposed over the first electrode and at least a portion of, and preferably all, exposed surfaces of the layer comprising quantum dots is exposed to small molecules and light flux prior to disposing the second electrode or any other device materials thereover.

The device can further include other device materials between the first electrode and the layer comprising quantum dots.

The device can further include other device materials between the layer comprising quantum dots and the second electrode.

Preferably, the device is prepared by a method for making a device taught herein.

In accordance with another aspect of the present invention, there is provided a device component including a layer comprising a charge transport material and a layer comprising quantum dots disposed over a surface thereof, wherein at least a portion of, and preferably all, exposed surfaces the layer comprising quantum dots emissive material has been exposed to small molecules and light flux.

The device component can further include other materials.

Preferably, the device component is prepared by a method for making a device component taught herein.

In certain aspects and embodiments of the methods taught herein, a light source such as an LED, a fluorescent lamp, or other light source with the desired emission spectra can provide the light flux. Other known light sources can be readily identified by the skilled artisan.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the description and drawings, from the claims, and from practice of the invention disclosed herein.

BRIEF DESCRIPTION OF THE DRAWINGS

In the drawings:

FIG. 6 illustrates performance data for an example of a device in accordance with the present invention.

Figure 1:
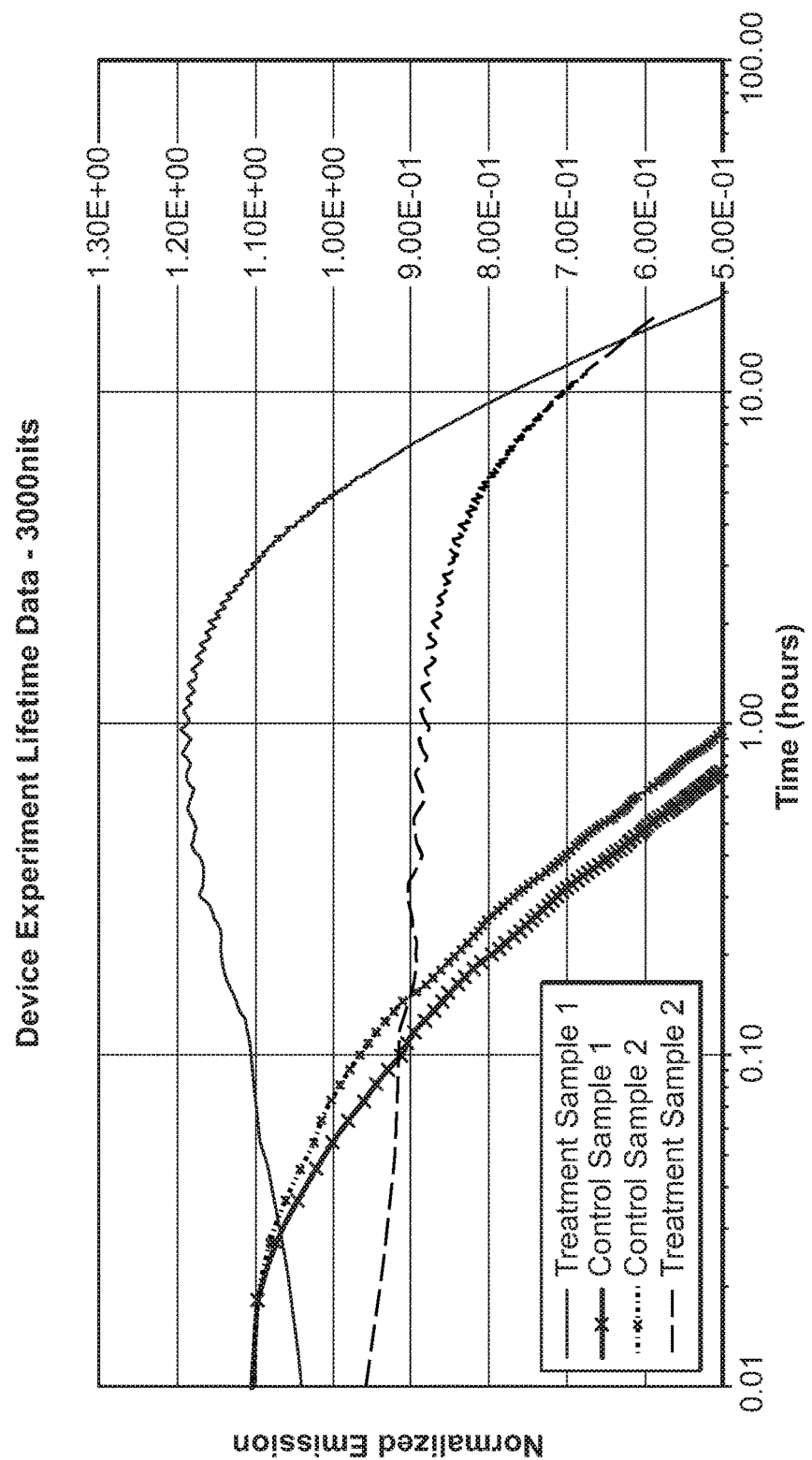
FIG. 1 graphically represents performance and lifetime data for the devices described in Example 2.

For a better understanding to the present invention, together with other advantages and capabilities thereof, reference is made to the following disclosure and appended claims in connection with the above-described drawings.

DETAILED DESCRIPTION OF THE INVENTION

In accordance with one aspect of the present invention, there is provided a method of making a device comprising forming a layer comprising quantum dots over a substrate including a first electrode, fixing the layer comprising quantum dots formed over the substrate, and exposing at least a portion of, and preferably all, exposed surfaces of the fixed layer comprising quantum dots to small molecules.

In certain preferred embodiments, the layer comprising quantum dots is fixed in the substantial absence of oxygen.

In certain preferred embodiments, the layer comprising quantum dots is fixed in the absence of oxygen.

In certain embodiments, a small molecule includes no more than 50 atoms.

In certain embodiments, a small molecule includes no more than 30 atoms.

In certain embodiments, a small molecule includes no more than 20 atoms.

In certain embodiments, a small molecule includes no more than 10 atoms.

In certain embodiments, a small molecule includes no more than 5 atoms.

A small molecule can have a molecular weight of less than or equal to 100 a.m.u.

Preferably a small molecule comprises a small polar molecule.

In certain embodiments, a small polar molecule comprises water.

In certain embodiments, a small polar molecule comprises a $C_1$-$C_3$ alcohol.

In certain embodiments, a small polar molecule comprises hydrogen sulfide.

In certain embodiments, a small polar molecule comprises phenol.

In certain embodiments, a small polar molecule comprises hydrazine.

In certain embodiments, a small polar molecule comprises arsine.

In certain embodiments, a small polar molecule comprises phosphine.

In certain embodiments, a small polar molecule comprises ammonia.

In certain embodiments, a small polar molecule comprises ammonium hydroxide.

In certain embodiments, a small polar molecule comprises hydrogen fluoride.

In certain embodiments, a small polar molecule comprises hydrogen chloride.

In certain embodiments, a small polar molecule comprises hydrogen bromide.

In certain embodiments, a small polar molecule comprises hydrogen iodide.

In certain embodiments, a small polar molecule comprises methanol.

In certain embodiments, a small polar molecule comprises ethanol.

In certain embodiments, a small polar molecule comprises a $C_1$-$C_3$ thiol.

Other small polar molecules may be useful or desirable.

In certain embodiments, a small molecule comprises a mixture of two or more different small molecules.

In certain embodiments, the small molecules are in gaseous state.

In certain embodiments, the small molecules are in liquid state.

In certain embodiments, the small molecules are included in a carrier gas.

In certain embodiments, the small molecules are included in a carrier liquid.

Mixtures including small molecules can also be used.

A small molecule can be in the form of a gas and/or liquid that can be further dispersed in a carrier gas or liquid.

In certain embodiments a small molecule can be included in a mist, vapor, spray, gas flow stream, etc.

In certain embodiments, a small polar molecule comprises a mixture comprising an inorganic salt (e.g., without limitation, sodium chloride) and water.

In certain embodiments, a small molecule includes a lone electron pair.

Other small molecules can be useful or desirable.

In certain embodiments, the small molecule exposure step is carried out in air.

In certain embodiments, the small molecule exposure step is carried out in the substantial absence of oxygen.

In certain embodiments, the small molecule exposure step is carried out in the absence of oxygen.

In certain embodiments, the small molecule exposure step is carried out in nitrogen.

In certain embodiments, the small molecule exposure step is carried out in argon.

In certain embodiments, exposure to small molecules is carried out at a temperature in a range from about 20° to about 80° C.

In certain embodiments, exposure to small molecules is carried out at a temperature in a range from about 20° to about 80° C. in air.

In certain embodiments, exposure to small molecules is carried out at a temperature in a range from about 20° to about 80° C. in the substantial absence of oxygen.

In certain embodiments, exposure to small molecules is carried out at a temperature in a range from about 20° to about 80° C. in the absence of oxygen.

In certain embodiments, exposure to small molecules is carried out at a temperature in a range from about 20° to about 80° C. in argon.

In certain embodiments, exposure to small molecules is carried out at a temperature in a range from about 20° to about 80° C. in nitrogen.

In certain embodiments, exposure to small molecules is carried out at a temperature of about 25° C.

In certain embodiments, the small molecule exposure step is carried out at room temperature.

In certain embodiments, the small molecule exposure step is carried out at a pressure of about 1 atmosphere.

In certain embodiments, the small molecule exposure step is carried out at a pressure of less than 1 atmosphere.

In certain embodiments, the small molecule exposure step is carried out at a pressure of greater than about 1 atmosphere.

Other pressures may be desirable or useful.

In certain embodiments, all or a portion of the exposed surfaces of the fixed layer comprising quantum dots is exposed to small molecules for at least about 30 seconds.

In certain embodiments, all or a portion of the exposed surfaces of the fixed layer comprising quantum dots is exposed to small molecules for at least about 5 minutes.

In certain embodiments, all or a portion of the exposed surfaces of the fixed layer comprising quantum dots is exposed to small molecules for at least about 15 minutes.

In certain embodiments, all or a portion of the exposed surfaces of the fixed layer comprising quantum dots is exposed to small molecules for a predetermined period of time.

Other times may be determined to be useful or desirable.

In certain embodiments, exposing all or a portion of the exposed surfaces of the fixed layer comprising quantum dots to small molecules comprises exposing the fixed layer formed over the substrate to an environment including small molecules that are in a gaseous state.

In certain embodiments, exposing all or a portion of the exposed surfaces of the fixed layer comprising quantum dots formed over the substrate to small molecules comprises exposing all or a portion of the exposed surfaces of the fixed layer comprising quantum dots formed over the substrate to an environment including small molecules that are in a liquid state.

In certain embodiments, the partial device including the fixed layer comprising quantum dots can be dipped in a liquid comprising a small molecule. In certain embodiments, the partial device including the fixed layer comprising quantum dots can be soaked in a liquid comprising a small molecule. In certain embodiments, a liquid comprising a small molecule can be contacted with all or a portion of the exposed surfaces of the layer comprising quantum dots. For example, a liquid comprising a small molecule can be poured over all or a portion of the exposed surfaces of the fixed layer comprising quantum dots; all or a portion of the exposed surfaces of the fixed layer comprising quantum dots can be sprayed with a liquid comprising a small molecule, etc.

Other techniques for exposing small molecules to all or a portion of exposed surfaces of the layer comprising quantum dots can be useful or desirable.

In certain embodiments, fixing the layer comprising quantum dots comprises heating the partial device including the layer comprising quantum dots formed over the substrate, preferably in an oxygen free atmosphere. In certain embodiments, the partial device is heated at a temperature in a range from about 80° C. to about 180° C. In certain embodiments, heating is carried out in vacuum. In certain embodiments, the fixing step is carried out in nitrogen. In certain embodiments, the fixing step is carried out in argon.

In certain embodiments, fixing the layer comprising quantum dots comprises subjecting the partial device including the layer comprising quantum dots formed over the substrate to vacuum evaporation, preferably in an oxygen free atmosphere. In certain of such embodiments, the partial device is further heated at a temperature in a range from about 80° C. to about 180° C. In certain embodiments, the fixing step is carried out in nitrogen. In certain embodiments, the fixing step is carried out in argon.

In certain embodiments, the method further comprises arranging a second electrode over the layer comprising quantum dots after exposure to small molecules.

In certain embodiments, the method further comprises including one or more additional layers in the device before including the second electrode.

In certain embodiments, the method further comprises forming a first layer comprising a material capable of transporting charge over the substrate including the first electrode prior to forming the layer comprising quantum dots.

In certain embodiments, the method further comprises forming a first layer comprising a material capable of transporting charge over the layer comprising quantum dots after exposure to small molecules.

In certain embodiments, the method further comprises forming a first layer comprising a material capable of transporting charge over the substrate including the first electrode prior to forming the layer comprising quantum dots, and forming a second layer comprising a material capable of transporting charge over the layer comprising quantum dots after exposure to small molecules.

In certain embodiments, the method further includes formation of additional layers.

In certain embodiments, the partial device is placed in an oxygen free atmosphere under vacuum of $10^{-6}$ or higher after exposure and prior to further processing.

In certain embodiments, method steps further included after the small molecule exposure step are performed in absence of oxygen.

In certain embodiments, the method further includes encapsulating a finished device in absence of oxygen.

In certain embodiments, the layer comprising quantum dots that is formed has a thickness up to about 100 nm.

In certain embodiments, the layer comprising quantum dots that is formed has a thickness of about 20 to about 30 nm.

In certain embodiments, the layer comprising quantum dots is a neat film.

In certain embodiments, the layer comprising quantum dots can comprise a matrix material in which the quantum dots are distributed. Such matrix materials can be readily ascertained by the skilled artisan.

In certain embodiments, forming the layer comprising quantum dots comprises applying an ink comprising quantum dots and a carrier liquid and removing the carrier liquid.

In certain embodiments, forming the layer comprising quantum dots comprises applying an ink comprising quantum dots and a carrier liquid and evaporating the carrier liquid. In certain embodiments, forming the layer comprising quantum dots comprises applying an ink comprising quantum dots and a carrier liquid and removing the carrier liquid. In certain embodiments, forming the layer comprising quantum dots comprises applying an ink comprising quantum dots and a carrier liquid and evaporating the carrier liquid. In certain embodiments, forming the layer comprising quantum dots comprises applying an ink comprising quantum dots and a carrier liquid and evaporating the carrier liquid by vacuum evaporation. In certain of such embodiments, after evaporation of the liquid carrier, the layer comprising quantum dots are heated in absence of oxygen to remove carrier liquid.

In certain embodiments, the device comprises a light emitting device.

In certain embodiments, the device comprises a photovoltaic device.

In certain embodiments, the device comprises a photodetector.

In certain embodiments, the device comprises a transistor.

In certain embodiments, the device comprises a memory device.

In certain embodiments, the quantum dots comprise semiconductor nanocrystals.

In certain embodiments, the quantum dots comprise a core comprising a first semiconductor material and a shell over at least a portion of an outer surface of the core, the shell comprising a second semiconductor material.

In certain embodiments, one or more ligands are attached to an outer surface of at least a portion of the quantum dot.

In certain embodiments, ligands include one or more aliphatic groups, which can be independently substituted or unsubstituted.

In certain embodiments, ligands include one or more aromatic groups, which can be independently substituted or unsubstituted.

In certain embodiments, the layer comprising quantum dots is formed over a predetermined area of the substrate.

In certain embodiments, the layer comprising quantum dots is patterned.

In certain embodiments, the layer comprising quantum dots is unpatterned.

In certain embodiments, the layer comprising quantum dots includes two or more different types of quantum dots. In certain of such embodiments, the different types of quantum dots emit light at a predetermined wavelength which is preferably distinct from that emitted by at least one of the other types included in the layer.

In certain embodiments, the method further comprises exposing at least a portion of, and preferably all, exposed surfaces of the layer comprising quantum dots to light flux while at least a portion of, and preferably all, exposed surfaces of the layer is in contact with small molecules.

In certain embodiments, the light flux includes a peak emission wavelength that can excite at least a portion of the quantum dots.

In certain embodiments, the light flux includes a peak emission wavelength in a range from about 365 nm to about 480 nm.

In certain embodiments, the light flux includes a peak emission wavelength in a range from about 400 nm to about 480 nm.

In certain embodiments, the light flux includes a peak emission wavelength in a range from about 450 nm to about 470 nm.

In certain embodiments, the light flux is provided by a light source with peak wavelength of about 470 nm.

In certain embodiments, the light flux is from about 10 to about 100 mW/cm$^2$.

In certain embodiments, the light flux is about 30 mW/cm$^2$.

In certain embodiments, light flux can be applied at regular or irregular intervals, for example, but not limited to, pulsed.

In certain embodiments, light flux can be applied without interruption during the exposure step.

In accordance with another aspect of the invention, there is provided a device obtainable by the above method for making a device.

In certain embodiments, the device comprises a light emitting device.

In certain embodiments, the device comprises a photovoltaic device.

In certain embodiments, the device comprises a photodetector.

In certain embodiments, the device comprises a transistor.

In certain embodiments, the device comprises a memory device.

In accordance with another aspect of the present invention, there is provided a method of making a device comprising forming a layer comprising quantum dots over a substrate including a first electrode, and exposing at least a portion, and preferably all, of the exposed surfaces of the layer comprising quantum dots to small molecules and light flux.

In certain embodiments, a small molecule includes no more than 50 atoms.

In certain embodiments, a small molecule includes no more than 30 atoms.

In certain embodiments, a small molecule includes no more than 20 atoms.

In certain embodiments, a small molecule includes no more than 10 atoms.

In certain embodiments, a small molecule includes no more than 5 atoms.

A small molecule can have a molecular weight of less than or equal to 100 a.m.u.

Preferably a small molecule comprises a small polar molecule.

Examples of small polar molecules include those described above and elsewhere herein.

In certain embodiments, a small molecule comprises a mixture of two or more different small molecules.

In certain embodiments, the small molecules are in gaseous state.

In certain embodiments, the small molecules are in liquid state.

In certain embodiments, the small molecules are included in a carrier gas.

In certain embodiments, the small molecules are included in a carrier liquid.

Mixtures including small molecules can also be used.

A small molecule can be in the form of a gas and/or liquid that can be further dispersed in a carrier gas or liquid.

In certain embodiments a small molecule can be included in a mist, vapor, spray, gas flow stream, etc.

In certain embodiments, a small polar molecule comprises a mixture comprising an inorganic salt (e.g., without limitation, sodium chloride) and water.

In certain embodiments, a small molecule includes a lone electron pair.

Other small molecules can be useful or desirable.

In certain embodiments, exposure to small molecules and light flux is carried out in air.

In certain embodiments, exposure to small molecules and light flux is carried out in the substantial absence of oxygen.

In certain embodiments, exposure to small molecules and light flux is carried out in the absence of oxygen.

In certain embodiments, exposure to small molecules and light flux is carried out in nitrogen.

In certain embodiments, exposure to small molecules and light flux is carried out in argon.

In certain embodiments, exposure to small molecules and light flux is carried out at a temperature in a range from about 20° to about 80° C.

In certain embodiments, exposure to small molecules and light flux is carried out at a temperature in a range from about 20° to about 80° C. in air.

In certain embodiments, exposure to small molecules and light flux is carried out at a temperature in a range from about 20° to about 80° C. in the substantial absence of oxygen.

In certain embodiments, exposure to small molecules and light flux is carried out at a temperature in a range from about 20° to about 80° C. in the absence of oxygen.

In certain embodiments, exposure to small molecules and light flux is carried out at a temperature in a range from about 20° to about 80° C. in argon.

In certain embodiments, exposure to small molecules and light flux is carried out at a temperature in a range from about 20° to about 80° C. in nitrogen.

In certain embodiments, exposure to small molecules and light flux is carried out at a temperature of about 25° C.

In certain embodiments, exposure to small molecules and light flux is carried out at room temperature.

In certain embodiments, exposure to small molecules and light flux is carried out at a pressure of about 1 atmosphere.

In certain embodiments, exposure to small molecules and light flux is carried out at a pressure of less than 1 atmosphere.

In certain embodiments exposure to small molecules and light flux is carried out at a pressure of greater than about 1 atmosphere.

Other pressures may be desirable or useful.

In certain embodiments, exposing all or a portion of the exposed surfaces of the layer comprising quantum dots formed over a substrate to small molecules comprises exposing all or a portion of the exposed surfaces of the layer comprising quantum dots formed over a substrate to an environment including the small molecules that are in a gaseous state.

In certain embodiments, exposing all or a portion of the exposed surfaces of the layer comprising quantum dots formed over a substrate comprises exposing all or a portion of the exposed surfaces of the layer comprising quantum dots formed over a substrate to an environment including the small molecules that are in a liquid state.

In certain embodiments, the partial device including the layer comprising quantum dots can be dipped in a liquid comprising a small molecule.

In certain embodiments, a liquid comprising a small molecule can be contacted with all or a portion of the exposed surfaces of the layer comprising quantum dots. For example, a liquid comprising a small molecule can be poured over all or a portion of the exposed surfaces of the layer comprising quantum dots; all or a portion of the exposed surfaces of the layer comprising quantum dots can be sprayed with a liquid comprising a small molecule, etc.

Other techniques for exposing small molecules to all or a portion of exposed surfaces of the layer comprising quantum dots can be useful or desirable.

In certain embodiments, the light flux includes a peak emission wavelength that can excite at least a portion of the quantum dots.

In certain embodiments, the light flux includes a peak emission wavelength in a range from about 365 nm to about 480 nm.

In certain embodiments, the light flux includes a peak emission wavelength in a range from about 400 nm to about 480 nm.

In certain embodiments, the light flux includes a peak emission wavelength in a range from about 450 nm to about 470 nm.

In certain embodiments, the light flux is provided by a light source with peak wavelength of about 470 nm.

In certain embodiments, the light flux is from about 10 to about 100 mW/cm$^2$.

In certain embodiments, the light flux is about 30 mW/cm$^2$.

In certain embodiments, light flux can be applied at regular or irregular intervals, for example, but not limited to, pulsed.

In certain embodiments, light flux can be applied without interruption during the exposure step.

In certain embodiments, at least a portion of, and preferably all, exposed surfaces of the layer comprising quantum dots is exposed to small molecules and the light flux for at least about 30 seconds. In certain embodiments, at least a portion of, and preferably all, exposed surfaces of the layer comprising quantum dots is simultaneously exposed to small molecules and the light flux for at least about 30 seconds.

In certain embodiments, at least a portion of, and preferably all, exposed surfaces of the layer comprising quantum dots is exposed to small molecules and the light flux for at least about 5 minutes. In certain embodiments, at least a portion of, and preferably all, exposed surfaces of the layer comprising quantum dots is simultaneously exposed to small molecules and the light flux for at least about 5 minutes.

In certain embodiments, at least a portion of, and preferably all, exposed surfaces of the layer comprising quantum dots is exposed to small molecules and the light flux for at least about 15 minutes. In certain embodiments, at least a portion of, and preferably all, exposed surfaces of the layer comprising quantum dots is simultaneously exposed to small molecules and the light flux for at least about 15 minutes.

Other times may be determined to be useful or desirable.

In certain embodiments, at least a portion of, and preferably all, exposed surfaces of the layer comprising quantum dots is exposed to small molecules for a first predetermined period of time and to light flux for a second predetermined period of time which can be the same or different from the first.

In certain embodiments, at least a portion of, and preferably all, exposed surfaces of the layer comprising quantum dots is simultaneously exposed to small molecules and the light flux for a predetermined period of time.

In certain embodiments, all or a portion of exposed surfaces of the layer comprising quantum dots can be exposed to small molecules and at least a portion of, and preferably all, of the exposed surfaces of the layer are then exposed to light flux while all or a portion of the layer comprising quantum dots is in contact with small molecules.

In certain embodiments, all or a portion of exposed surfaces of the layer comprising quantum dots can be exposed to light flux at least a portion of the time while all or a portion of exposed surfaces of the layer comprising quantum dots is being exposed to small molecules. In certain of such embodiments, exposure to light flux can continue after exposure to small molecules is stopped. In certain of such embodiments, exposure to small molecules can continue after exposure to light flux is stopped.

In certain embodiments, at least a portion of, and preferably all, exposed surfaces of the layer comprising quantum dots is exposed to small molecules prior to exposure to light flux.

In certain embodiments, at least a portion of, and preferably all, exposed surfaces of the layer comprising quantum dots is exposed to small molecules after exposure to light flux.

In certain embodiments, the method further comprises arranging a second electrode over the layer comprising quantum dots after exposure to small molecules and light flux.

In certain embodiments, the method further comprises including one or more additional layers in the device before including the second electrode.

In certain embodiments, the method further comprises forming a first layer comprising a material capable of transporting charge over the substrate including the first electrode prior to forming the layer comprising quantum dots.

In certain embodiments, the method further comprises forming a first layer comprising a material capable of transporting charge over the layer comprising quantum dots after exposure to small molecules and light flux.

In certain embodiments, the method further comprises forming a first layer comprising a material capable of transporting charge over the substrate including the first electrode prior to forming the layer comprising quantum dots, and forming a second layer comprising a material capable of transporting charge over the layer comprising quantum dots after exposure to small molecules and light flux.

In certain embodiments, the partial device is placed in an oxygen free atmosphere under vacuum of $10^{-6}$ or higher after exposure and prior to further processing.

In certain embodiments, the method further includes formation of additional layers.

In certain embodiments, method steps further included after the exposure step are performed in absence of oxygen.

In certain embodiments, the method further includes encapsulating a finished device in absence of oxygen.

In certain embodiments, the layer comprising quantum dots that is formed has a thickness up to about 100 nm.

In certain embodiments, the layer comprising quantum dots that is formed has a thickness of about 20 to about 30 nm.

In certain embodiments, the layer comprising quantum dots is a neat film.

In certain embodiments, the layer comprising quantum dots can comprise a matrix material in which the quantum dots are distributed. Such matrix materials can be readily ascertained by the skilled artisan.

In certain embodiments, forming the layer comprising quantum dots comprises applying an ink comprising quantum dots and a carrier liquid and removing the carrier liquid.

In certain embodiments, forming the layer comprising quantum dots comprises applying an ink comprising quantum dots and a carrier liquid and evaporating the carrier liquid.

In certain embodiments, forming the layer comprising quantum dots comprises applying an ink comprising quantum dots and a carrier liquid and evaporating the carrier liquid by vacuum evaporation. In certain of such embodiments, after evaporation of the liquid carrier, the layer comprising quantum dots are heated in absence of oxygen to remove carrier liquid.

In certain embodiments, the device comprises a light emitting device.

In certain embodiments, the device comprises a photovoltaic device.

In certain embodiments, the device comprises a photodetector.

In certain embodiments, the device comprises a transistor.

In certain embodiments, the device comprises a memory device.

In certain embodiments, the quantum dots comprise semiconductor nanocrystals.

In certain embodiments, the quantum dots comprise a core comprising a first semiconductor material and a shell over at least a portion of an outer surface of the core, the shell comprising a second semiconductor material.

In certain embodiments, one or more ligands are attached to an outer surface of at least a portion of the quantum dot.

In certain embodiments, ligands include one or more aliphatic groups, which can be independently substituted or unsubstituted.

In certain embodiments, ligands include one or more aromatic groups, which can be independently substituted or unsubstituted.

In certain embodiments, the layer comprising quantum dots is formed over a predetermined area of the substrate.

In certain embodiments, the layer comprising quantum dots is patterned.

In certain embodiments, the layer comprising quantum dots is unpatterned.

In certain embodiments, the layer comprising quantum dots includes two or more different types of quantum dots. In certain of such embodiments, the different types of quantum dots emit light at a predetermined wavelength which is preferably distinct from that emitted by at least one of the other types included in the layer.

In certain embodiments, a method of making a device comprises forming a layer comprising quantum dots over a substrate including a first electrode, exposing at least a portion of, and preferably all, exposed surfaces of the layer comprising quantum dots to small molecules; and irradiating at least a portion of, and preferably all, exposed surfaces of the layer comprising quantum dots with light flux while all or a portion of such exposed surfaces is in contact with small molecules. In certain embodiments, the partial device is irradiated with the light flux while the partial device is in an environment including small molecules.

The present methods of making a device can address lifetime and/or performance problems that can occur in a device including quantum dots.

In accordance with another aspect of the invention, there are provided devices obtainable by the methods of making a device described herein.

In certain embodiments, the device comprises a light emitting device.

In certain embodiments, the device comprises a photovoltaic device.

In certain embodiments, the device comprises a photodetector.

In certain embodiments, the device comprises a transistor.

In certain embodiments, the device comprises a memory device.

In certain embodiments, a device prepared by an embodiment of the method includes a substrate, an anode disposed on the substrate, a hole injection layer disposed over the substrate, a material capable of transporting holes disposed over the hole injection layer, a layer comprising quantum dots over the hole injection layer, a material capable of transporting electrons disposed over the layer comprising quantum dots, and a cathode disposed over the material capable of transporting electrons.

In certain preferred embodiments, a device prepared by an embodiment of the method includes a substrate, a cathode disposed on the substrate, a material capable of transporting electrons disposed over the cathode, a layer comprising quantum dots over the material capable of transporting electrons, a material capable of transporting holes disposed over the layer comprising quantum dots, a hole injection layer disposed over the material capable of transporting holes, and an anode disposed over the hole injection layer. In certain embodiments, the material capable of transporting electrons is also capable of injecting electrons. In certain of such embodiments, the material comprises a metal oxide, preferably ZnO. (In certain embodiments, a metal oxide layer can be formed by a sol-gel process or by sputtering.)

In accordance with another aspect of the present invention, there is provided a method of making a film including a layer comprising quantum dots, the method comprising forming a layer comprising quantum dots over a carrier substrate, fixing the layer comprising quantum dots formed over the carrier substrate, and exposing at least a portion of, and preferably all, exposed surfaces of the fixed layer comprising quantum dots to small molecules.

In certain preferred embodiments, the layer comprising quantum dots is fixed in the substantial absence of oxygen.

In certain preferred embodiments, the layer comprising quantum dots is fixed in the absence of oxygen.

In certain embodiments, a small molecule includes no more than 50 atoms.

In certain embodiments, a small molecule includes no more than 30 atoms.

In certain embodiments, a small molecule includes no more than 20 atoms.

In certain embodiments, a small molecule includes no more than 10 atoms.

In certain embodiments, a small molecule includes no more than 5 atoms.

A small molecule can have a molecular weight of less than or equal to 100 a.m.u.

Preferably a small molecule comprises a small polar molecule.

Examples of small polar molecules include those described above and elsewhere herein. In certain embodiments, a small molecule comprises a mixture of two or more different small molecules.

In certain embodiments, the small molecules are in gaseous state.

In certain embodiments, the small molecules are in liquid state.

In certain embodiments, the small molecules are included in a carrier gas.

In certain embodiments, the small molecules are included in a carrier liquid.

Mixtures including small molecules can also be used.

A small molecule can be in the form of a gas and/or liquid that can be further dispersed in a carrier gas or liquid.

In certain embodiments a small molecule can be included in a mist, vapor, spray, gas flow stream, etc.

In certain embodiments, a small polar molecule comprises a mixture comprising an inorganic salt (e.g., without limitation, sodium chloride) and water.

In certain embodiments, a small molecule includes a lone electron pair.

Other small molecules can be useful or desirable.

In certain embodiments, a small molecule includes a lone electron pair.

In certain embodiments, the small molecule exposure step is carried out in air.

In certain embodiments, the small molecule exposure step is carried out in the substantial absence of oxygen.

In certain embodiments, the small molecule exposure step is carried out in the absence of oxygen.

In certain embodiments, the small molecule exposure step is carried out in nitrogen.

In certain embodiments, the small molecule exposure step is carried out in argon.

In certain embodiments, exposure to small molecules is carried out at a temperature in a range from about 20° to about 80° C.

In certain embodiments, exposure to small molecules is carried out at a temperature in a range from about 20° to about 80° C. in air.

In certain embodiments, exposure to small molecules is carried out at a temperature in a range from about 20° to about 80° C. in the substantial absence of oxygen.

In certain embodiments, exposure to small molecules is carried out at a temperature in a range from about 20° to about 80° C. in the absence of oxygen.

In certain embodiments, exposure to small molecules is carried out at a temperature in a range from about 20° to about 80° C. in argon.

In certain embodiments, exposure to small molecules is carried out at a temperature in a range from about 20° to about 80° C. in nitrogen.

In certain embodiments, exposure to small molecules is carried out at a temperature of about 25° C.

In certain embodiments, the small molecule exposure step is carried out at room temperature.

In certain embodiments, the small molecule exposure step is carried out at a pressure of about 1 atmosphere.

In certain embodiments, the small molecule exposure step is carried out at a pressure of less than 1 atmosphere.

In certain embodiments, the small molecule exposure step is carried out at a pressure of greater than about 1 atmosphere.

Other pressures may be desirable or useful.

In certain embodiments, all or a portion of the exposed surfaces of the layer comprising quantum dots is exposed to small molecules for at least about 30 seconds.

In certain embodiments, all or a portion of the exposed surfaces of the layer comprising quantum dots is exposed to small molecules for at least about 5 minutes.

In certain embodiments, all or a portion of the exposed surfaces of the layer comprising quantum dots is exposed to small molecules for at least about 15 minutes.

Other times may be determined to be useful or desirable.

In certain embodiments, all or a portion of the exposed surfaces of the layer comprising quantum dots is exposed to small molecules for a predetermined period of time.

In certain embodiments, exposing all or a portion of the exposed surfaces of the layer comprising quantum dots to small molecules comprises exposing the fixed layer formed over the substrate to an environment including the small molecules that are in a gaseous state.

In certain embodiments, exposing all or a portion of the exposed surfaces of the fixed layer comprising quantum dots formed over the substrate to small molecules comprises exposing all or a portion of the exposed surfaces of the fixed layer comprising quantum dots formed over the substrate to an environment including the small molecules that are in a liquid state.

In certain embodiments, a liquid comprising a small molecule can be contacted with all or a portion of the exposed surfaces of the fixed layer comprising quantum dots formed over the carrier substrate For example, a liquid comprising a small molecule can be poured over all or a portion of the exposed surfaces of the fixed layer comprising quantum dots; all or a portion of the exposed surfaces of the fixed layer comprising quantum dots can be sprayed with a liquid comprising a small molecule, etc.

Other techniques for exposing small molecules to all or a portion of exposed surfaces of the layer comprising quantum dots can be useful or desirable.

In certain embodiments, fixing the layer comprising quantum dots comprises heating the layer comprising quantum dots formed over the carrier substrate, preferably in an oxygen free atmosphere. In certain embodiments, layer comprising quantum dots formed over the carrier substrate is heated at a temperature in a range from about 80° C. to about 180° C. In certain embodiments, heating is carried out in vacuum. In certain embodiments, the fixing step is carried out in nitrogen. In certain embodiments, the fixing step is carried out in argon.

In certain embodiments, fixing the layer comprising quantum dots comprises subjecting the layer comprising quantum dots formed over the carrier substrate to vacuum evaporation, preferably in an oxygen free atmosphere. In certain of such embodiments, the layer comprising quantum dots formed over the carrier substrate is further heated at a temperature in a range from about 80° C. to about 180° C. In certain embodiments, the fixing step is carried out in nitrogen. In certain embodiments, the fixing step is carried out in argon.

In certain embodiments, the method further comprises forming one or more other layers over the carrier substrate prior to forming the layer comprising quantum dots.

In certain embodiments, the method further comprises forming a one ore more other layers over the fixed layer comprising quantum dots after exposure to small molecules.

In certain embodiments, the layer comprising quantum dots that is formed has a thickness up to about 100 nm.

In certain embodiments, the layer comprising quantum dots that is formed has a thickness of about 20 to about 30 nm.

In certain embodiments, the layer comprising quantum dots is a neat film.

In certain embodiments, the layer comprising quantum dots can comprise a matrix material in which the quantum dots are distributed. Such matrix materials can be readily ascertained by the skilled artisan.

In certain embodiments, forming the layer comprising quantum dots comprises applying an ink comprising quantum dots and a carrier liquid and evaporating the carrier liquid.

In certain embodiments, forming the layer comprising quantum dots comprises applying an ink comprising quantum dots and a carrier liquid and evaporating the carrier liquid by vacuum evaporation. In certain of such embodiments, after evaporation of the liquid carrier, the layer comprising quantum dots are heated in absence of oxygen to remove carrier liquid.

In certain embodiments, the film can be included in a device comprising a light emitting device.

In certain embodiments, the film can be included in a device comprising a photovoltaic device.

In certain embodiments, the film can be included in a device comprising a photodetector.

In certain embodiments, the film can be included in a device comprising a transistor.

In certain embodiments, the film can be included in a device comprising a memory device.

In certain embodiments, the quantum dots comprise semiconductor nanocrystals.

In certain embodiments, the quantum dots comprise a core comprising a first semiconductor material and a shell over at least a portion of an outer surface of the core, the shell comprising a second semiconductor material.

In certain embodiments, one or more ligands are attached to an outer surface of at least a portion of the quantum dot.

In certain embodiments, ligands include one or more aliphatic groups, which can be independently substituted or unsubstituted.

In certain embodiments, ligands include one or more aromatic groups, which can be independently substituted or unsubstituted.

In certain embodiments, the layer comprising quantum dots is formed over a predetermined area of the substrate.

In certain embodiments, the layer comprising quantum dots is patterned.

In certain embodiments, the layer comprising quantum dots is unpatterned.

In certain embodiments, the layer comprising quantum dots includes two or more different types of quantum dots. In certain of such embodiments, the different types of quantum dots emit light at a predetermined wavelength which is preferably distinct from that emitted by at least one of the other types included in the layer.

In certain embodiments, the method further comprises exposing at least a portion of, and preferably all, exposed surfaces of the layer comprising quantum dots to light flux while at least a portion of, and preferably all, exposed surfaces of the layer is in contact with small molecules.

In certain embodiments, the method can comprise exposing at least a portion of, and preferably all, exposed surfaces of the layer comprising quantum dots to light flux prior to exposing any exposed surfaces of the layer with small molecules.

In certain embodiments, the light flux includes a peak emission wavelength that can excite at least a portion of the quantum dots.

In certain embodiments, the light flux includes a peak emission wavelength in a range from about 365 nm to about 480 nm.

In certain embodiments, the light flux includes a peak emission wavelength in a range from about 400 nm to about 480 nm.

In certain embodiments, the light flux includes a peak emission wavelength in a range from about 450 nm to about 470 nm.

In certain embodiments, the light flux is provided by a light source with peak wavelength of about 470 nm.

In certain embodiments, the light flux is from about 10 to about 100 mW/cm$^2$.

In certain embodiments, the light flux is about 30 mW/cm$^2$.

In certain embodiments, light flux can be applied at regular or irregular intervals, for example, but not limited to, pulsed.

In certain embodiments, light flux can be applied without interruption during the exposure step.

In certain embodiments, the carrier substrate comprises a tape.

In accordance with another aspect of the present invention, there is provided a method of making a device component including a layer comprising quantum dots, the method comprising forming a layer comprising quantum dots over a layer comprising a charge transport material, and exposing at least a portion, and preferably all, of the exposed surfaces of the layer comprising quantum dots to small molecules and light flux.

In certain embodiments at least a portion, and preferably all, of the exposed surfaces of the layer comprising quantum dots are exposed to small molecules and light flux.

In certain embodiments, a small molecule includes no more than 50 atoms.

In certain embodiments, a small molecule includes no more than 30 atoms.

In certain embodiments, a small molecule includes no more than 20 atoms.

In certain embodiments, a small molecule includes no more than 10 atoms.

In certain embodiments, a small molecule includes no more than 5 atoms.

A small molecule can have a molecular weight of less than or equal to 100 a.m.u.

Preferably a small molecule comprises a small polar molecule.

In certain embodiments, a small polar molecule comprises water.

Examples of small polar molecules include those described above and elsewhere herein.

In certain embodiments, a small molecule comprises a mixture of two or more different small molecules.

In certain embodiments, the small molecules are in gaseous state.

In certain embodiments, the small molecules are in liquid state.

In certain embodiments, the small molecules are included in a carrier gas.

In certain embodiments, the small molecules are included in a carrier liquid.

Mixtures including small molecules can also be used.

A small molecule can be in the form of a gas and/or liquid that can be further dispersed in a carrier gas or liquid.

In certain embodiments a small molecule can be included in a mist, vapor, spray, gas flow stream, etc.

In certain embodiments, a small polar molecule comprises a mixture comprising an inorganic salt (e.g., without limitation, sodium chloride) and water.

In certain embodiments, a small molecule includes a lone electron pair.

Other small molecules can be useful or desirable.

In certain embodiments, exposure to small molecules and light flux step is carried out in air.

In certain embodiments, exposure to small molecules and light flux is carried out in the substantial absence of oxygen.

In certain embodiments, exposure to small molecules and light flux is carried out in the absence of oxygen.

In certain embodiments exposure to small molecules and light flux is carried out in nitrogen.

In certain embodiments, exposure to small molecules and light flux is carried out in argon.

In certain embodiments, exposure to small molecules and light flux is carried out at a temperature in a range from about 20° to about 80° C.

In certain embodiments, exposure to small molecules and light flux is carried out at a temperature in a range from about 20° to about 80° C. in air.

In certain embodiments, exposure to small molecules and light flux is carried out at a temperature in a range from about 20° to about 80° C. in the substantial absence of oxygen.

In certain embodiments, exposure to small molecules and light flux is carried out at a temperature in a range from about 20° to about 80° C. in the absence of oxygen.

In certain embodiments, exposure to small molecules and light flux is carried out at a temperature in a range from about 20° to about 80° C. in argon.

In certain embodiments, exposure to small molecules and light flux is carried out at a temperature in a range from about 20° to about 80° C. in nitrogen.

In certain embodiments, exposure to small molecules and light flux is carried out at a temperature of about 25° C.

In certain embodiments, exposure to small molecules and light flux is carried out at room temperature.

In certain embodiments, exposure to small molecules and light flux is carried out at a pressure of about 1 atmosphere.

In certain embodiments, exposure to small molecules and light flux is carried out at a pressure of less than 1 atmosphere.

In certain embodiments exposure to small molecules and light flux is carried out at a pressure of greater than about 1 atmosphere.

Other pressures may be desirable or useful.

In certain embodiments, the light flux includes a peak emission wavelength that can excite at least a portion of the quantum dots.

In certain embodiments, the light flux includes a peak emission wavelength in a range from about 365 nm to about 480 nm.

In certain embodiments, the light flux includes a peak emission wavelength in a range from about 400 nm to about 480 nm.

In certain embodiments, the light flux includes a peak emission wavelength in a range from about 450 nm to about 470 nm.

In certain embodiments, the light flux is provided by a light source with peak wavelength of about 470 nm.

In certain embodiments, the light flux is from about 10 to about 100 mW/cm$^2$.

In certain embodiments, the light flux is about 30 mW/cm$^2$.

In certain embodiments, light flux can be applied at regular or irregular intervals, for example, but not limited to, pulsed.

In certain embodiments, light flux can be applied without interruption during the exposure step.

In certain embodiments, all or a portion of the exposed surfaces of the layer comprising quantum dots is exposed to small molecules and light flux for at least about 30 seconds.

In certain embodiments, all or a portion of the exposed surfaces of the layer comprising quantum dots is exposed to small molecules and light flux for at least about 5 minutes.

In certain embodiments, all or a portion of the exposed surfaces of the layer comprising quantum dots is exposed to small molecules and light flux for at least about 15 minutes.

Other times may be determined to be useful or desirable.

In certain embodiments, at least a portion of, and preferably all, exposed surfaces of the layer comprising quantum dots is exposed to small molecules for a first predetermined period of time and to light flux for a second predetermined period of time which can be the same or different from the first.

In certain embodiments, at least a portion of, and preferably all, exposed surfaces of the layer comprising quantum dots is simultaneously exposed to small molecules and the light flux for a predetermined period of time.

In certain embodiments, all or a portion of exposed surfaces of the layer comprising quantum dots can be exposed to small molecules and at least a portion of, and preferably all, of the exposed surfaces of the layer are then exposed to light while all or a portion of the layer comprising quantum dots is in contact with small molecules.

In certain embodiments, all or a portion of exposed surfaces of the layer comprising quantum dots can be exposed to light during at least a portion of the time while all or a portion of exposed surfaces of the layer comprising quantum dots is exposed to small molecules. In certain of such embodiments, exposure to light flux can continue after exposure to small molecules is stopped. In certain of such embodiments, exposure to small molecules can continue after exposure to light flux is stopped.

In certain embodiments, at least a portion of, and preferably all, exposed surfaces of the layer comprising quantum dots is exposed to small molecules prior to exposure to light flux.

In certain embodiments, at least a portion of, and preferably all, exposed surfaces of the layer comprising quantum dots can be exposed to small molecules after exposure to light flux.

Charge transport materials are described elsewhere herein.

In certain preferred embodiments, the layer comprising a charge transport material includes a semiconductor material. In certain of such embodiments, the semiconductor material can have a band gap (in eV) greater than $1240/\lambda$, wherein $\lambda$ represents the peak emission wavelength (in nm) of light emitted by quantum dots in the layer comprising quantum dots. In certain of embodiments including more than one type of quantum dot with different peak emission wavelengths, the bandgap of the semiconductor is greater than 1240/λ, wherein λ represents the peak emission wavelength of the type of quantum dot that has the lowest peak emission wavelength of the different types of quantum dots included in the layer. In certain of such embodiments, the semiconductor comprises an inorganic material. Examples include, but are not limited to, metal chalcogenides, such as metal oxides, metal sulfides, etc. Such semiconductors can be n-type, p-type, or intrinsic based on the intended use of the component. An example of a preferred semiconductor includes zinc oxide.

In certain embodiments, the method can further comprise including one or more other layers prior to forming the layer comprising quantum dots.

In certain embodiments, the method can further include forming the device component on a carrier substrate. In certain of such embodiments, the layer comprising charge transport material can be formed on the carrier substrate and the layer comprising quantum dots can be formed thereover. In certain of such embodiments, the method can further comprise including one or more other layers prior to forming the layer comprising quantum dots. In certain embodiments, the carrier substrate can be a tape or other rollable form of substrate.

In certain embodiments, the method further comprises forming a one ore more other layers over the layer comprising quantum dots after exposure to small molecules and light flux.

In certain embodiments, method steps following exposure to small molecules and light flux are carried out in absence of oxygen.

In certain embodiments, exposing all or a portion of the exposed surfaces of the layer comprising quantum dots formed over a substrate to small molecules comprises exposing all or a portion of the exposed surfaces of the layer comprising quantum dots formed over the carrier substrate to an environment including the small molecules that are in a gaseous state.

In certain embodiments, exposing all or a portion of the exposed surfaces of the layer comprising quantum dots formed over the carrier substrate comprises exposing all or a portion of the exposed surfaces of the layer comprising quantum dots formed over a substrate to an environment including the small molecules that are in a liquid state.

In certain of such embodiments, a liquid comprising a small molecule can be contacted with all or a portion of the exposed surfaces of the layer comprising quantum dots formed over the carrier substrate. For example, a liquid comprising a small molecule can be poured over all or a portion of the exposed surfaces of the layer comprising quantum dots; all or a portion of the exposed surfaces of the layer comprising quantum dots can be sprayed with a liquid comprising a small molecule, etc.

Other techniques for exposing small molecules to all or a portion of exposed surfaces of the layer comprising quantum dots can be useful or desirable.

In certain embodiments, the layer comprising quantum dots that is formed has a thickness up to about 100 nm.

In certain embodiments, the layer comprising quantum dots that is formed has a thickness of about 20 to about 30 nm.

In certain embodiments, the layer comprising quantum dots is a neat film.

In certain embodiments, the layer comprising quantum dots can comprise a matrix material in which the quantum dots are distributed. Such matrix materials can be readily ascertained by the skilled artisan.

In certain embodiments, forming the layer comprising quantum dots comprises applying an ink comprising quantum dots and a carrier liquid and removing the carrier liquid.

In certain embodiments, forming the layer comprising quantum dots comprises applying an ink comprising quantum dots and a carrier liquid and evaporating the carrier liquid.

In certain embodiments, forming the layer comprising quantum dots comprises applying an ink comprising quantum dots and a carrier liquid and evaporating the carrier liquid by vacuum evaporation. In certain of such embodiments, after evaporation of the liquid carrier, the layer comprising quantum dots are heated in absence of oxygen to remove carrier liquid.

In certain embodiments, the device component can be included in a device comprising a light emitting device.

In certain embodiments, the device component can be included in a device comprising a photovoltaic device.

In certain embodiments, the device component can be included in a device comprising a photodetector.

In certain embodiments, the device component can be included in a device comprising a transistor.

In certain embodiments, the device component can be included in a device comprising a memory device.

In certain embodiments, the quantum dots comprise semiconductor nanocrystals.

In certain embodiments, the quantum dots comprise a core comprising a first semiconductor material and a shell over at least a portion of an outer surface of the core, the shell comprising a second semiconductor material.

In certain embodiments, one or more ligands are attached to an outer surface of at least a portion of the quantum dot.

In certain embodiments, ligands include one or more aliphatic groups, which can be independently substituted or unsubstituted.

In certain embodiments, ligands include one or more aromatic groups, which can be independently substituted or unsubstituted.

In certain embodiments, the layer comprising quantum dots is formed over a predetermined area of the layer comprising charge transport material.

In certain embodiments, the layer comprising quantum dots is patterned.

In certain embodiments, the layer comprising quantum dots is unpatterned.

In certain embodiments, the layer comprising quantum dots includes two or more different types of quantum dots. In certain of such embodiments, the different types of quantum dots emit light at a predetermined wavelength which is preferably distinct from that emitted by at least one of the other types included in the layer.

In certain embodiments, a method of making a device component comprising quantum dots comprises forming a layer comprising quantum dots over a layer comprising a charge transport material, exposing at least a portion of, and preferably all, exposed surfaces of the layer comprising quantum dots to small molecules; and irradiating at least a portion of, and preferably all, exposed surfaces of the layer comprising quantum dots with light flux while all or a portion of such exposed surfaces is in contact with small molecules. In certain embodiments, irradiation with the light flux is carried out while the layer comprising quantum dots over a layer comprising a charge transport material is in an environment including small molecules. In certain embodiments, irradiation with the light flux is carried out before the layer comprising quantum dots over a layer comprising a charge transport material is in an environment including small molecules. In certain embodiments, irradiation with the light flux is carried out after the layer comprising quantum dots over a layer comprising a charge transport material is exposed to an environment including small molecules.

In accordance with another aspect of the invention, there is provided a device component obtainable by the methods described herein for making a device component.

The present methods of making a device component, a film, and a device can address lifetime and/or performance problems that can occur with use of quantum dots in devices.

Figure 8:
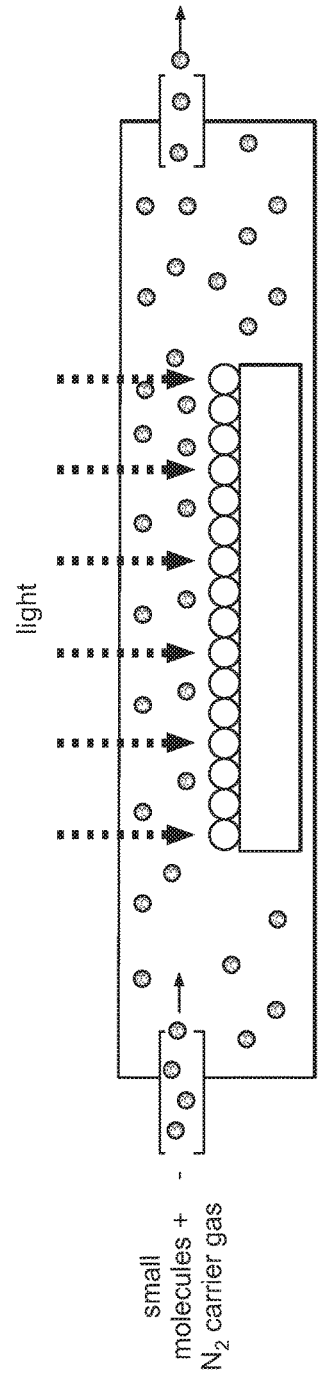
FIG. 8 depicts a schematic of an example of a configuration useful with the present invention.

FIG. 8 schematically illustrates a cross-section of an example of configuration useful in carrying out the methods described herein. The configuration as shown depicts exposure to both small molecules and light flux. (Such configuration can also be used for exposure to small molecule or light separately.) The depicted unit is closed to the environment during use with an inlet for introduction of carrier gas (shown as nitrogen) including small molecules into the chamber and an outlet for exiting carrier gas and entrained small molecules. The top surface of the chamber is transparent to the light flux being shone into the chamber. The chamber can be opened for placement and removal of the sample including a layer of quantum dots being treated. In preferred embodiments, the carrier gas including small molecules is prepared by bubbling carrier gas through a vessel of the desired small molecules (in liquid form) prior to being introduced into the chamber.

Other configurations or arrangements can be useful or desirable.

Examples of carrier liquids for use in an ink included in the various aspects and embodiments of the inventions described above and elsewhere herein, include, by way of example, but not limited to, those listed in International Application No. PCT/US2007/008873, entitled "Composition Including Material, Methods Of Depositing Material, Articles Including Same And Systems For Depositing Material" of QD Vision, Inc. filed 9 Apr. 2007, which published as International Publication No. WO 2007/117698 on Oct. 18, 2007, which is hereby incorporated herein by reference in its entirety. A carrier liquid can also comprise a mixture of one or more carrier liquids. One non-limiting example includes a mixture of hexane and heptane. In certain embodiments, a carrier liquid with a boiling point of about 95 C or greater is desirable. Other carrier liquids can also be useful or desirable for use in an ink.

Examples of techniques useful for depositing an ink included in the various aspects and embodiments of the inventions described herein, include, by way of example, but not limited to, spin-coating, contact printing, ink-jet printing, roll-to-roll printing, graveure, stamping, spraying, stenciling, screen-printing, photopatterning, etching, etc. Other techniques can also be useful or desirable.

Hole transport and electron transport layers referred to above and elsewhere herein can be collectively referred to as charge transport layers (which may also be referred to as layers comprising a material capable of transporting charge). Either or both of these layers can comprise organic or inorganic materials capable of transporting charge. Examples of inorganic material include, for example, inorganic semiconductors. An inorganic material can be amorphous or polycrystalline. Examples of organic material include, for example, organic semiconductors. An organic charge transport material can be polymeric or non-polymeric.

An example of a typical organic material that can be included in an electron transport layer includes a molecular matrix. The molecular matrix can be non-polymeric. The molecular matrix can include a small molecule, for example, a metal complex. The metal complex of 8-hydoryquinoline can be an aluminum, gallium, indium, zinc or magnesium complex, for example, aluminum tris(8-hydroxyquinoline) ($Alq_3$). In certain embodiments, the electron transport material can comprise LT-N820 or LT-N821 (1,3-Bis[2-(2,2'-bypyridine-6-yl)-1,3,4-oxadiazo-5-yl]benzene (also abbreviated as Bpy-OXD), available from Luminescent Technologies, Taiwan. For additional information relating to Bpy-OXD, see M. Ichikawa et al., J. Mater. Chem., 2006, 16, 221-25, the disclosure of which is hereby incorporated herein by reference in its entirety. Other classes of materials in the electron transport layer can include metal thioxinoid compounds, oxadiazole metal chelates, triazoles, sexithiophenes derivatives, pyrazine, and styrylanthracene derivatives. An electron transport layer comprising an organic material may be intrinsic (undoped) or doped. Doping may be used to enhance conductivity.

An example of a typical organic material that can be included in a hole transport layer includes an organic chromophore. The organic chromophore can include a phenyl amine, such as, for example, N,N'-diphenyl-N,N'-bis(3-mehtylphenyl)-(1,1'-biphenyl)-4,4'-diamine (TPD). Other hole transport layer can include spiro-TPD, 4-4'-N,N'-dicarbazolyl-biphenyl (CBP), 4,4-. bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, or an N,N,N',N'-tetraarylbenzidine. A hole transport layer comprising an organic material may be intrinsic (undoped) or doped. Doping may be used to enhance conductivity.

Charge transport layers comprising organic materials and other information related to fabrication of organic charge transport layers are discussed in more detail in U.S. patent application Ser. No. 11/253,612 for "Method And System For Transferring A Patterned Material", filed 21 Oct. 2005, and Ser. No. 11/253,595 for "Light Emitting Device Including Semiconductor Nanocrystals", filed 21 Oct. 2005. The foregoing patent applications are hereby incorporated herein by reference in its entirety.

Organic charge transport layers may be disposed by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr). Most preferably, the organic layers are deposited at high vacuum conditions from about $1 \times 10^{-7}$ to about $5 \times 10^{-6}$ torr. Alternatively, organic layers may be formed by multi-layer coating while appropriately selecting solvent for each layer. Examples of charge transport layers that can be solvent cast include but are not limited to fluorine-based polymers such as Poly(9,9'-dioctylfluorene-co-bis-N,N'-(4-butylphenyl)-bis-N,N'-phenyl-1, 4-phenylene-diamine) (PFB) and poly(9,9'-dioctylfluorene-co-N-(4-butylphenyl)diphenylenediamine) (TFB).

Charge transport layers including inorganic materials and other information related to fabrication of inorganic charge transport layers are discussed further below and in more detail in U.S. Patent Application No. 60/653,094 for "Light Emitting Device Including Semiconductor Nanocrystals", filed 16 Feb. 2005 and U.S. patent application Ser. No. 11/354,185, filed 15 Feb. 2006, and International Application No. PCT/US2009/002123 filed 3 Apr. 2009 of QD Vision, Inc. for "Light-Emitting Device Including Quantum Dots", the disclosures of each of which are hereby incorporated herein by reference in their entireties.

Examples of inorganic semiconductor materials include a metal chalcogenide, a metal pnictide, or elemental semiconductor, such as a metal oxide, a metal sulfide, a metal selenide, a metal telluride, a metal nitride, a metal phosphide, a metal arsenide, or metal arsenide. For example, an inorganic semiconductor material can include, without limitation, zinc oxide, a titanium oxide, a niobium oxide, an indium tin oxide, copper oxide, nickel oxide, vanadium oxide, chromium oxide, indium oxide, tin oxide, gallium oxide, manganese oxide, iron oxide, cobalt oxide, aluminum oxide, thallium oxide, silicon oxide, germanium oxide, lead oxide, zirconium oxide, molybdenum oxide, hafnium oxide, tantalum oxide, tungsten oxide, cadmium oxide, iridium oxide, rhodium oxide, ruthenium oxide, osmium oxide, zinc sulfide, zinc selenide, zinc telluride, cadmium sulfide, cadmium selenide, cadmium telluride, mercury sulfide, mercury selenide, mercury telluride, silicon carbide, diamond (carbon), silicon, germanium, aluminum nitride, aluminum phosphide, aluminum arsenide, aluminum antimonide, gallium nitride, gallium phosphide, gallium arsenide, gallium antimonide, indium nitride, indium phosphide, indium arsenide, indium antimonide, thallium nitride, thallium phosphide, thallium arsenide, thallium antimonide, lead sulfide, lead selenide, lead telluride, iron sulfide, indium selenide, indium sulfide, indium telluride, gallium sulfide, gallium selenide, gallium telluride, tin selenide, tin telluride, tin sulfide, magnesium sulfide, magnesium selenide, magnesium telluride, barium titanate, barium zirconate, zirconium silicate, yttria, silicon nitride, and a mixture of two or more thereof. In certain embodiments, the inorganic semiconductor material can include a dopant.

In certain preferred embodiments, an electron transport material can include an n-type dopant.

An example of a preferred inorganic semiconductor material for inclusion in an electron transport material of a device in accordance with the invention is zinc oxide. In certain embodiments, zinc oxide can be mixed or blended with one or more other inorganic materials, e.g., inorganic semiconductor materials, such as titanium oxide.

Selection of a charge transport material can be determined by the skilled artisan.

In certain embodiments, the semiconductor has a band gap (in eV) greater than $1240/\lambda$, wherein $\lambda$ represents the peak emission wavelength (in nm) of light emitted by quantum dots in the layer comprising quantum dots. In certain of embodiments including more than one type of quantum dot with different peak emission wavelengths, the bandgap of the semiconductor is greater than $1240/\lambda$, wherein $\lambda$ represents the peak emission wavelength of the type of quantum dot that has the lowest peak emission wavelength of the different types of quantum dots included in the layer.

Charge transport layers comprising an inorganic semiconductor can be deposited on a substrate at a low temperature, for example, by a known method, such as a vacuum vapor deposition method, an ion-plating method, sputtering, inkjet printing, etc.

A charge transport material is typically included in the device as a layer with a thickness in a range from about 10 nm to 500 nm Other thicknesses may be determined to be useful or desirable.

Other optional layers (e.g., charge transport layer (e.g., comprising a material capable of transporting holes or electrons), hole blocking layers, hole injection layers, etc.) may be deposited using any suitable technique.

Examples of cathode materials include without limitation, ITO, aluminum, silver, gold, etc. The cathode preferably comprises a material with a work function chosen with regard to the quantum dots included in the device. Other materials can be identified by the skilled artisan.

An anode may comprise an electrically conductive metal or its oxide that can easily inject holes. Examples include, but are not limited to, ITO, aluminum, aluminum-doped zinc oxide (AZO), silver, gold, etc. Other suitable anode materials are known and can be readily ascertained by the skilled artisan. The anode material can be deposited using any suitable technique. In certain embodiments, the anode can be patterned.

Additional information useful concerning devices and device materials can be found in International Application No. PCT/US2008/013504, filed Dec. 8, 2008, which published as PCT Publication No. WO2009/099425 on Aug. 13, 2009; International Application No. PCT/US2007/013152, filed Jun. 4, 2007, which published as PCT Publication No. WO2007/143197 on Dec. 13, 2007, and International Application No. PCT/US2009/02123, filed Apr. 3, 2009, which published as PCT Publication No. WO2009/123763 on Oct. 8, 2009, each of the foregoing being hereby incorporated herein by reference in its entirety.

In certain embodiments an additional hole transport material with a hole conductivity between that of the hole injection material and the hole transport material can be interposed between them. Additional hole transport materials can be interposed between two other hole conductive materials included in the device. Preferably, any additional interposed hole transport material will have a hole conductivity that falls in-between those of the hole transport materials between which it is interposed.

In certain embodiments, a device can further include a passivation or other protective layer that can be used to protect the device from the environment. For example, a protective glass layer can be included to encapsulate the device. Optionally a desiccant or other moisture absorptive material can be included in the device before it is sealed, e.g., with an epoxy, such as a UV curable epoxy. Other desiccants or moisture absorptive materials can be useful or desirable.

In certain embodiments, a device comprises a light-emitting device. In certain embodiments, a light emitting device can include red-emitting, green-emitting, and/or blue-emitting quantum dots. Other color light-emitting quantum dots can be included, alone or in combination with one or more other different quantum dots. In certain embodiments, separate layers of one or more different quantum dots may be desirable. In certain embodiments, a layer can include a mixture of two or more different quantum dots.

A substrate useful in various aspects and embodiments of the inventions described herein can be opaque or transparent. A transparent substrate can be used, for example, in the manufacture of a transparent light emitting device. See, for example, Bulovic, V. et al., *Nature* 1996, 380, 29; and Gu, G. et al., *Appl. Phys. Lett.* 1996, 68, 2606-2608, each of which is incorporated by reference in its entirety. The substrate can be rigid or flexible. The substrate can be plastic, metal, semiconductor, a semiconductor wafer, or glass. The substrate can be a substrate commonly used in the art. Preferably the substrate has a smooth surface. A substrate surface free of defects is particularly desirable. Other known materials and suppliers of such materials are available to those of ordinary skill in the art through various sources. The following examples of carrier substrates can also be used as substrates.

Examples of carrier substrates useful in various aspects and embodiments of the inventions described herein include, but are not limited to, Kapton 200E, Kapton 300H, Kapton 500H, other Kapton materials, PET, TEONEX, silicone treated PET, etc. Other examples include, but are not limited to, plastic, foil (including, but not limited to, metal foil), paper, nylon, cloth, the materials listed herein as examples of mask materials, cellulose based products, fabrics, plastics, including, for example, but not limited to, ABS, acetates, butyrates, phenolics, polycarbonates, polyesters, polyethylenes, polypropylenes, polystyrenes, polyurethanes and polyvinyl chlorides as monomers, copolymers and/or laminates. The above examples of substrates can also be used as carrier substrates. Various forms of substrate can also be utilized, e.g., but not limited to, plates, sheets, tapes, rollable material, etc. The material of construction, including the form and shape, of a substrate may be selected based on intended use.

Other known materials useful as substrates and suppliers of such materials are available to those of ordinary skill in the art through various sources.

In accordance with another aspect of the present invention, there is provided device a including a first electrode, a second electrode, and a layer comprising quantum dots disposed between the electrodes, wherein the layer comprising quantum dots is disposed over the first electrode and at least a portion of, and preferably all, exposed surfaces of the layer comprising quantum dots is exposed to small molecules and light flux prior to disposing the second electrode or any other device materials thereover.

The device can further include other device materials between the first electrode and the layer comprising quantum dots.

The device can further include other device materials between the layer comprising quantum dots and the second electrode.

A small molecule can have a molecular weight of less than or equal to 100 a.m.u.

Examples of small molecules include, but are not limited to, those described above and elsewhere herein.

A small molecule is preferably a polar molecule. Examples of small polar molecules include those described above and elsewhere herein.

Exposure to small molecules and light flux can be carried out in air.

Exposure to small molecules and light flux can be carried out in the substantial absence of oxygen.

Exposure to small molecules and light flux can be carried out in the absence of oxygen.

In certain preferred embodiments, at least a portion, and preferably all, of the exposed surfaces of the emissive material comprising quantum dots is exposed to small molecules and light flux.

Exposure to small molecules and light flux can be carried out at a temperature in a range from about 20° to about 80° C.

Light flux can include a peak emission wavelength that can excite at least a portion of the quantum dots.

Light flux can include a peak emission wavelength in a range from about 365 nm to about 480 nm.

Light flux can include a peak emission wavelength in a range from about 400 nm to about 480 nm.

Light flux can include a peak emission wavelength in a range from about 450 nm to about 470 nm.

Light flux can include a peak emission wavelength of about 470 nm.

Light flux can be provided by a light source with peak wavelength at a desired wavelength.

Light flux can comprise from about 10 to about 100 $mW/cm^2$.

Light flux can comprise about 30 $mW/cm^2$.

In certain embodiments, light flux can be applied at regular or irregular intervals, for example, but not limited to, pulsed.

In certain embodiments, light flux can be applied without interruption during the exposure step.

In an exemplary, but not limiting, example of an embodiment of the present invention, a device includes quantum dots (QDs) (preferably that are colloidally prepared) that are disposed on an electron transport layer (which can comprise one or more layers, wherein a layer preferably comprises an inorganic material (e.g., a metal oxide or other metal chalcogenide, other inorganic semiconductor material, mixtures including any one or more of the foregoing), wherein the layer comprising quantum dots is exposed to small polar molecules (e.g., water vapour) while irradiated with $\lambda$=450 nm wavelength light before a hole transport layer (which can comprise one or more layers, wherein a layer preferably comprises a molecular organic material capable of transporting holes) is disposed thereover. A hole injection layer (which can comprise one or more layers) can be disposed over the hole transport layer, and a metal anode is disposed over the hole injection layer.

Other small molecules and light fluxes described herein can be used. Other small molecules and light fluxes may also be determined to be useful or desirable.

Exposing emissive material including quantum dots to small molecules and light prior to disposing other material thereon can improve performance (efficiency and/or stability) of optoelectronic devices based on QDs, e.g., colloidal QDs.

Figure 3:
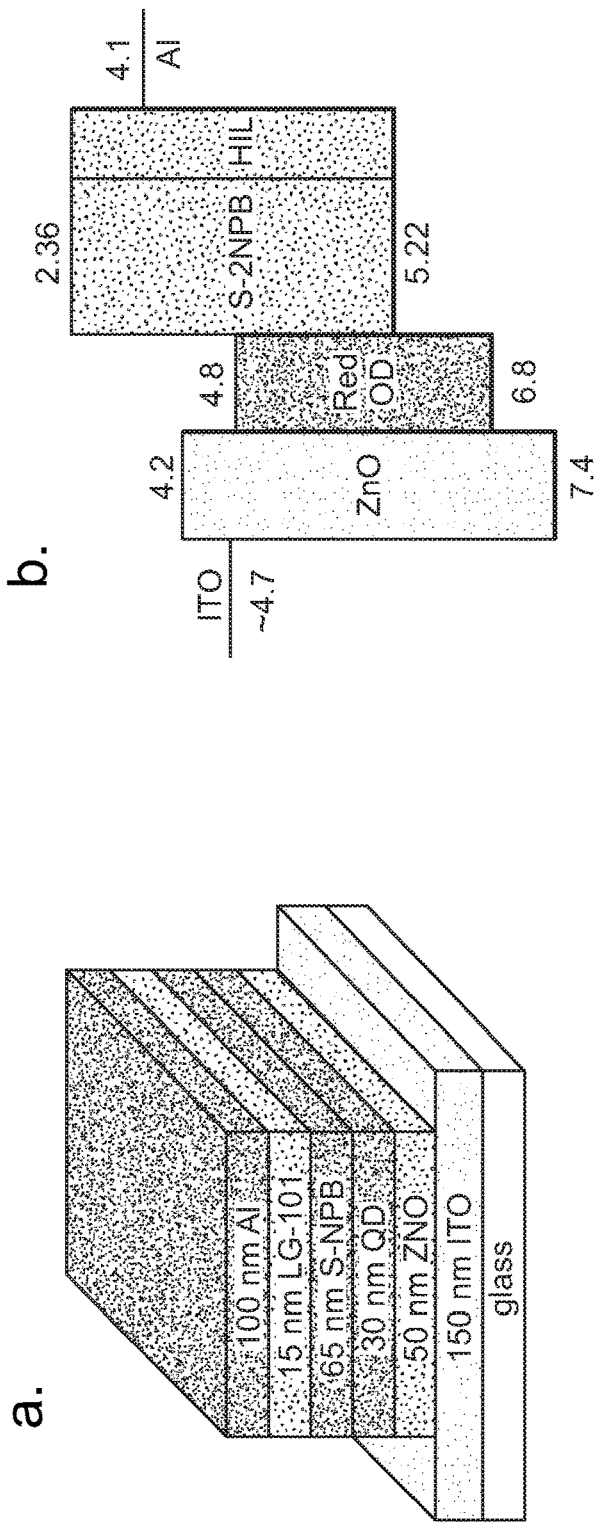
FIG. 3 depicts an example of a preferred structure of a device (a) including an emissive layer including quantum dots for use in the present invention and a schematic of the energy band diagram (b).

A schematic of an example of a device in accordance with the present invention is shown in FIG. 3(a). The depicted example shows a device structure of an inverted QLED. The depicted inverted device structure includes a patterned indium tin oxide (ITO) bottom electrode that serves as the cathode. Other structures may also be useful or desirable. A thin layer of zinc-oxide (ZnO), which acts as the electron injection and transport layer, is disposed over the cathode. An emissive material comprising a layer including from about 2 to 3 layers of red QDs (e.g., with a Solution Quantum Yield >80%) is deposited on top of ZnO, which is capped with a thin layer of hole transporting material (e.g., 2,2',7,7'-tetrakis[N-naphthalenyl(phenyl)-amino]-9,9-spirobifluorene (spiro2-NPB, available from Luminescence Technology Corp, LT-N125)). A thin layer of LG101 (LG Chemical) hole injection layer is disposed over the hole transport layer, and an aluminium anode is disposed over the hole injection layer. FIG. 3(b) depicts a schematic of the energy band diagram for the device structure depicted in FIG. 3(a). (Energies shown are in eV and are referenced to the vacuum level.)

ZnO is a preferred electron injection and electron transport layer because of its low contact resistance to ITO cathode and its conduction band alignment with the lowest unoccupied molecular orbital (LUMO) of QDs, facilitating ease of electron injection into the QD multi-layer (See FIG. 3b). The ZnO layer also provides a chemically and mechanically robust surface for QD deposition, extending flexibility in subsequent processing steps owing to its insolubility in organic solvents. Preferably, the ZnO layer is annealed at elevated temperatures. In the preferred inverted QLED geometry, such annealing can be done prior to depositing the layer comprising quantum dots, avoiding exposure of such layer to the deleterious effects of heating. Other electron transport and/or injection materials can also be useful or desirable.

As described above and elsewhere herein, at least a portion, and preferably all, exposed surfaces of emissive material can be exposed to small molecules (preferably small polar molecules) and light after it is included in a device during device fabrication, prior to deposition of another material or device layer (e.g., electrode or one or more other device layer(s)) thereover. Examples of other device materials and/or layers include, for example, but not limited to, those capable of charge transport, charge injection, charge blocking, etc.)

In an example of a preferred embodiment of the present invention, after the quantum dot layer is deposited on top of a device layer (e.g., a ZnO layer), the layer is first baked in a vacuum oven to remove the colloidal dispersion solvent, and then the layer is simultaneously exposed to small polar molecules (e.g., the vapor of water molecules) and blue light of ≈450 nm wavelength.

Additional information useful concerning devices and methods in accordance with the present invention is found in International Application No. PCT/US2009/02123, filed Apr. 3, 2009, which published as PCT Publication No. WO2009/123763 on Oct. 8, 2009, International Application No. PCT/US2010/23859, of QD Vision, Inc., filed 28 Apr. 2010, International Application No. PCT/US2010/32799 of QD Vision, Inc., filed 28 Apr. 2010, and International Application No. PCT/US2010/51867 of QD Vision, Inc., filed 7 Oct. 2010, each of the foregoing being hereby incorporated herein by reference in its entirety.

The present invention will be further clarified by the following examples, which are intended to be exemplary of the present invention.

EXAMPLES

Example 1—Preparation of Semiconductor Nanocrystals Capable of Emitting Red Light with Octadecylphosphonic Acid and Decylamine Synthesis of CdSe Cores: 26.25 mmol cadmium acetate is dissolved in 235.4 mmol of tri-n-octylphosphine at 100° C. in a 250 mL 3-neck round-bottom flask and then dried and degassed for one hour. 465.5 mmol of trioctylphosphine oxide and 59.9 mmol of octadecylphosphonic acid are added to a 0.5 L glass reactor and dried and degassed at 140° C. for one hour. After degassing, the Cd solution is added to the reactor containing the oxide/acid and the mixture was heated to 270° C. under nitrogen. Once the temperature reaches 270° C., 240 mmol of tri-n-butylphosphine is injected into the flask. The temperature is then raised to 295° C. where 60 mL of 1.5 M TBP-Se is then rapidly injected. The reaction mixture temperature drops to 272° C. and is allowed to run for 1 minute at which point the heating mantle is removed from the reaction flask and the apparatus is cooled via two air guns. The first absorption peak of the nanocrystals is 551 nm. The CdSe cores are precipitated out of the growth solution inside a nitrogen atmosphere glovebox by adding a 3:1 mixture of methanol and isopropanol. The isolated cores are then dissolved in hexane and used to make core-shell materials.

Synthesis of CdSe/CdZnS Core-Shell Nanocrystals: 25.86 mmol of trioctylphosphine oxide and 2.4 mmol of octadecylphosphonic acid are loaded into a 50 mL four-neck round bottom flask. The mixture is then dried and degassed in the reaction vessel by heating to 120° C. for about an hour. The flask is then cooled to 70° C. and the hexane solution containing isolated CdSe cores from above (0.0891 mmol Cd content) is added to the reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S is in two-fold excess relative to the Cd and Zn. Two sets of Cd/Zn (0.28 mmol of dimethylcadmium and diethylzinc) and S (1.12 mmol of hexamethyldisilathiane) samples are each dissolved in 4 mL of trioctylphosphine inside a nitrogen atmosphere glove box. Once the precursor solutions are prepared, 0.48 mL of decylamine is added to the reaction flask and the mixture is heated to 155° C. under nitrogen. The Cd/Zn and S precursor solutions are added dropwise to the respective reaction flasks over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The resulting precipitate is then dispersed in hexane and precipitated out of solution for a second time by adding a 3:1 mixture of methanol and isopropanol. The isolated core-shell nanocrystals are then dispersed in hexane and used to make quantum dot light emitting devices. (Abs/Emission/FWHM (nm)=597/609/31).

Example 2—Devices Fabricated with CdSe/CdZnS Core-Shell Particles

Two sets of devices are fabricated with CdSe/CdZnS core-shell particles generally as follows:

Glass (50 mm×50 mm) with patterned indium tin oxide (ITO) electrodes on one surface is cleaned with UV Ozone for about 6 minutes to remove contaminants.

An electron transport/electron injection layer comprising zinc oxide is prepared as follows. A zinc acetate [Zn(ac)] solution is spun coated at 2000 rpm onto the ITO.

Subsequent annealing at 300° C. on hot plate for 5 minutes in air converts Zn(ac) to Zinc oxide. Rinsing of the annealed Zn(ac) layer in de-ionized water, ethanol and acetone is expected to remove solvent or residual organic material from the surface, leaving predominantly crystalline ZnO layer with nanoscale domain size. The target thickness of ZnO layer is about 50 nm.

The metal oxide coated glass is then transferred into a nitrogen-filled glove box, which normally has oxygen and water levels below 1 ppm. A coating formulation including quantum dots in hexane prepared substantially in accordance with Example 1 is spun coated on ZnO surface at 2000 rpm for about 30 seconds. The target thickness of quantum dot layer is about 30 nm. Then the quantum dot layer is baked at 80° C. for 30 minutes in a vacuum oven to remove the solvent.

At this point the control samples are stored in a glove box under nitrogen, while treatment samples are placed into a box filled with about 80% humidity air at 70° C. and exposed to fluorescent light for fifteen minutes. Once this step is completed, the treatment samples are placed in the glove box under nitrogen.

Fabrication of both sets of samples is then continued. All samples are transferred to a vacuum deposition chamber and pumped down to $10^{-6}$ torr or better for evaporation of subsequent device layers.

An approximately 65 nm layer of hole transport material (s-2NPB) is then evaporated onto the emissive layer in a deposition chamber after the chamber is pumped down to $10^{-6}$ torr or better.

A hole injection layer (LG-101 available from LG Chem, LTD.) (approximately 15 nm) is formed over the hole transport layer by evaporation techniques.

100 nm Al anode is deposited.

The finished devices are encapsulated.

The lifetime data for the devices prepared substantially in accordance with Example 2 are graphically presented in FIG. 1. A device prepared with a quantum dot layer that is treated with small polar molecules under irradiation is referred to in FIG. 1 as a "Treatment Sample" and enumerated; a device not so treated is referred to in FIG. 1 as "Control Sample" and enumerated. For each device a current is applied to achieve an initial test luminance of 3000 nits. The light output is measured by a photodiode and the luminance vs. time trace is recorded using custom acquisition electronics and recorded by custom software running on a personal computer. (While custom electronics and software were used to evaluate the samples, other electronics and software will be expected to demonstrate similar comparative results.) All devices are tested until their half-life is reached. The device half-life is defined as the amount of time required for a device to reach half (50%) of its initial luminance under constant current drive conditions. The data in FIG. 1 demonstrates better lifetime for both treatment samples by over an order of magnitude.

Example 3—QD Synthesis

General:

Tri-n-octylphosphine oxide (99%), tri-n-octylphosphine (97%), tri-n-butylphosphine (99%), di-methylcadmium (97%), and selenium shot (99.99%) are purchased from Strem and used without further purification. Di-ethylzinc (52 wt. % Zn, min), hexamethyldisilathiane (synthesis grade), and decylamine (>99.5%) are purchased from Sigma-Aldrich and used without further purification. Octadecylphosphonic acid is purchased from PCI Synthesis Inc. and used without further purification.

Synthesis of CdSe Cores:

1.75 mmol cadmium acetate is dissolved in 15.7 mmol of tri-n-octylphosphine at 140° C. in a 20 mL vial and then dried and degassed for one hour. 31.0 mmol of tri-n-octylphosphine oxide and 4 mmol of octadecylphosphonic acid are added to a 3-neck flask and dried and degassed at 110° C. for one hour. After degassing, the Cd solution is added to the oxide/acid flask and the mixture is heated to 270° C. under nitrogen. Once the temperature reached 270° C., 16 mmol of tri-n-butylphosphine is injected into the flask. The temperature is then raised to 327° C. where 4.0 mL of 1.5 M TBP-Se is then rapidly injected. The reaction mixture is heated at 300° C. for 60 seconds and then the heating mantle is removed and the reaction flask is rapidly cooled to 100° C. with the aid of an air gun. The CdSe cores are transferred air free into a nitrogen atmosphere glovebox and precipitated out of the growth solution by adding a 3:1 mixture of methanol and isopropanol. The isolated cores are then dissolved in hexane and used to make core-shell materials. (Abs/Emission/FWHM (nm)=549/564/31).

Figure 2:
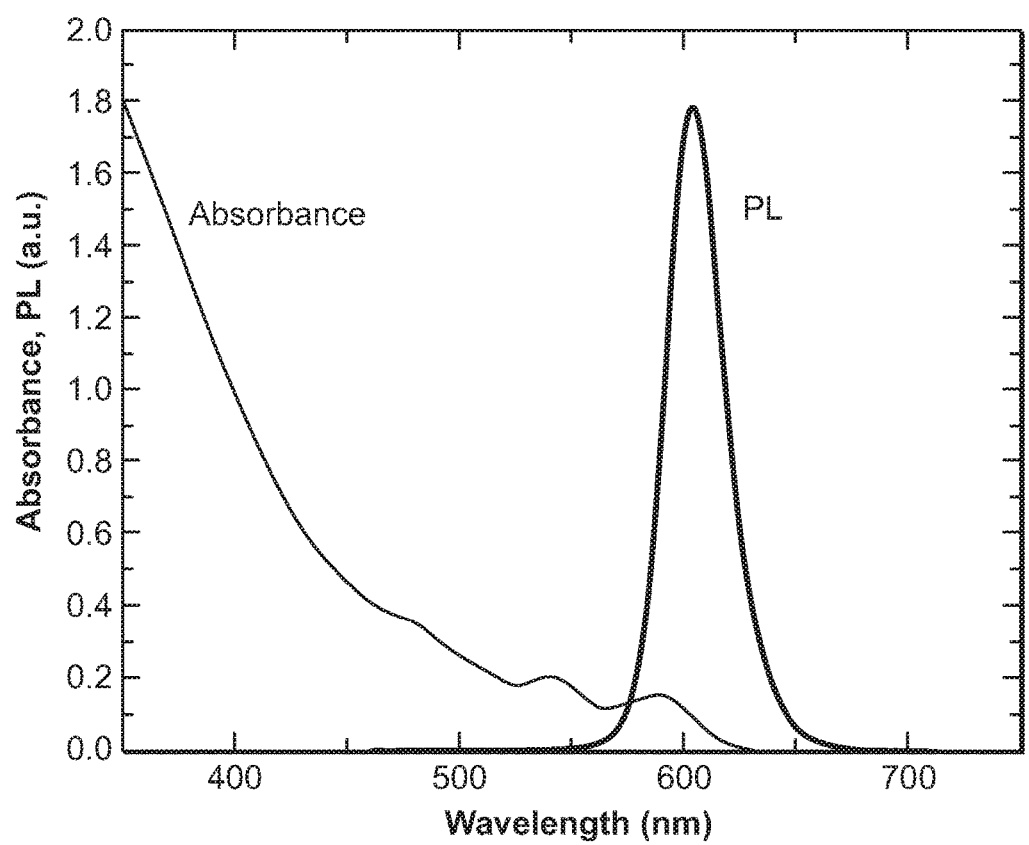
FIG. 2 illustrates absorption and PL spectra of QDs of Example 3.

Synthesis of CdSe/CdZnS Core-Shell Nanocrystals:

25.86 mmol of trioctylphosphine oxide and 2.4 mmol of octadecylphosphonic acid are loaded into a 50 mL four-neck round bottom flask. The mixture is then dried and degassed in the reaction vessel by heating to 120° C. for about an hour. The flask is then cooled to 70° C. and the hexane solution containing isolated CdSe cores from above (0.103 mmol CdSe content) is added to the reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S is in two-fold excess relative to the Cd and Zn. Two sets of Cd/Zn (0.29 mmol of dimethylcadmium and diethylzinc) and S (1.17 mmol of hexamethyldisilathiane) samples are each dissolved in 4 mL of trioctylphosphine inside a nitrogen atmosphere glove box. Once the precursor solutions are prepared, 0.48 mL of decylamine is added to the reaction flask and the mixture is heated to 155° C. under nitrogen. The Cd/Zn and S precursor solutions are added dropwise to the respective reaction flasks over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The resulting precipitate is then dispersed in hexane and precipitated out of solution for a second time by adding a 3:1 mixture of methanol and isopropanol. The isolated core-shell quantum dot (QD) nanocrystals are then dispersed in hexane and used to make QLEDs. The absorption and PL spectra of QDs in hexane are given in FIG. 2.

Example 4—QLED Device Fabrication

Electron-Injection Layer (EIL) and Electron Transport Layer (ETL) Material Synthesis:

An electron transport layer comprising zinc oxide is prepared from a solution of 12.56 g of zinc acetate [Zn(ac)] dehydrate (Aldrich, 99.999% purity), 76.8 ml of 2-methoxyethanol anhydrous 99.8% and 3.2 ml of ethanolamine redistilled 99.5+%. The Zn(ac) solution is then mixed and shaken or magnetically stirred for 3 hours on a stirring plate and then an ultrasonic agitation is applied for 2 hours in a DI water filled bath.

QLED Fabrication:

Two sets of devices are fabricated with CdSe/CdZnS core-shell particles. The devices are made as follows. Glass (50 mm×50 mm in area) with patterned indium tin oxide (ITO) electrodes on one surface is cleaned ultrasonically using sequential immersions in de-ionized water, acetone and isopropyl alcohol baths, which is followed by cleaning with oxygen plasma for 6 minutes to remove contaminants. The EIL/ETL solution is spun coated at 2000 rpm onto the ITO. Subsequent annealing at 300° C. on a hot plate for 5 minutes in air converts Zn(ac) to Zinc oxide. After baking, the annealed ZnO layer is rinsed with de-ionized water and methanol to remove any residual organic material from the surface. The thickness of ZnO layer is approximately 50 nm. The substrate is then transferred into nitrogen-filled glove box, which normally has oxygen and water levels below 1 ppm. A coating formulation including quantum dots in hexane is spin coated on the ZnO surface at 2000 rpm for about 30 seconds. The target thickness of the quantum dot layer is about 30 nm. The quantum dot layer is then baked at 80° C. for 30 minutes in a vacuum oven to remove the solvent. At this point the control samples are stored in a glove box under nitrogen, while the samples that will undergo water vapour treatment are placed into a box filled with 80% humidity air at 21° C. and exposed to light from a blue LED source (with wavelength of 450 nm, and intensity of 20 mW/cm$^2$) for approximately fifteen minutes (a set of samples was also exposed to humid N$_2$, rather than humid air, giving similar results). Once this step is completed, the water-vapour-treated samples are placed back into the nitrogen glove box for further processing. All samples are then transferred to a vacuum deposition chamber and pumped down to $10^{-7}$ Torr for evaporation of subsequent device layers. A 65 nm thick layer of hole transport material (s-2NPB) is first evaporated onto the QD emissive layer, and then a 15 nm thick hole injection layer (LG-101 available from LG Chem, LTD) is deposited. Finally, a 100 nm thick Al anode is deposited to complete the device. The package is then environmentally sealed using a UV-curable epoxy.

FIGS. 4-7 illustrate performance results for light emitting devices prepared generally in accordance with Examples 3 and 4 above.

The device performance testing results shown in FIGS. 4-7 were generally measured as follows:

Quantum dot photoluminescence spectra are measured using a Cary Eclipse fluorescence spectrophotometer. QLED devices are fabricated on custom ITO-glass substrates with pixel sizes ranging from 1×1 mm² to 4×4 mm². Device light-current-voltage (L-I-V) and external quantum efficiency (EQE) measurements are made in a dark box using a Keithley 2602 Source Meter and a large area silicon photodetector, using previously established techniques. Color measurements and luminance measurements are made using a calibrated Konica-Minolta CS-200 Chromameter. The EL spectra are captured using an Ocean Optics spectrometer. Unless otherwise specified, for each device a current is applied to achieve an initial test luminance of 1,000 Cd/m². The light output is measured by a photodiode and the luminance vs. time trace is recorded using custom acquisition electronics and recorded by custom software running on a personal computer. (While custom electronics and software were used to evaluate the samples, other electronics and software will be expected to demonstrate similar comparative results.) All devices are tested until their half-life is reached. The device half-life is defined as the amount of time required for a device to reach half (50%) of its initial luminance under constant current drive conditions.

Figure 4:
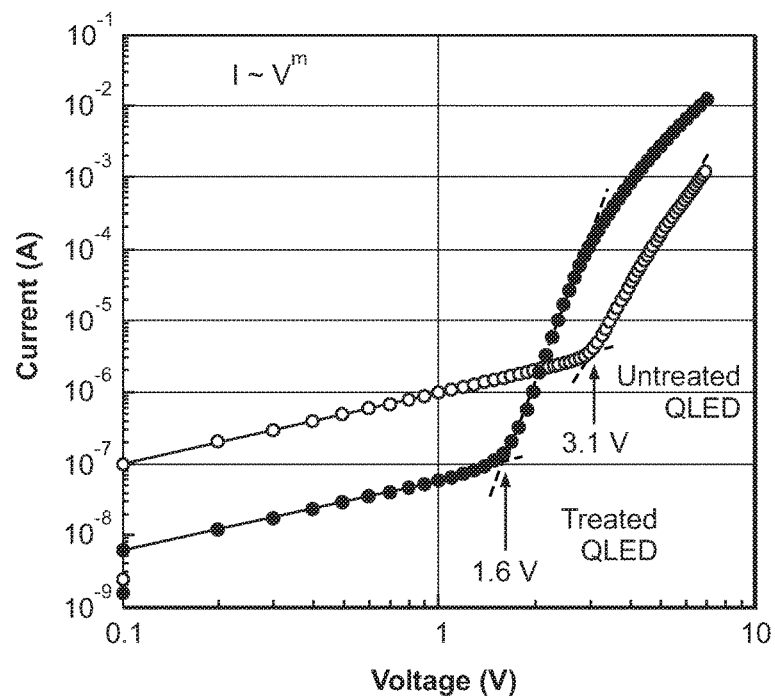
FIG. 4 illustrates I-V characteristics of an example of a device in accordance with the present invention and a control device.

FIG. 4 graphically represents the I-V characteristics of a treated QLED and an untreated QLED. As described above, the QLEDS include ZnO/spiro2-NPB. The QLEDs are 1 mm² in area. (The data for the treated QLED is shown by filled symbols; the data for the untreated QLED is shown by open symbols.) As shown in FIG. 4, exposure of quantum dot layer to, for example, water vapour and light, leads to notable changes in the light-current-voltage (L-I-V) characteristics of the corresponding light emitting devices (which are also referred to in this discussion and related FIGURES as a "Treated QLEDs" or "Treated Devices"). Data shown in FIG. 4 relating to control devices including a quantum dot layer not exposed to water vapour and light are referred to as "Untreated QLEDS" or "Untreated Devices".

Figure 5:
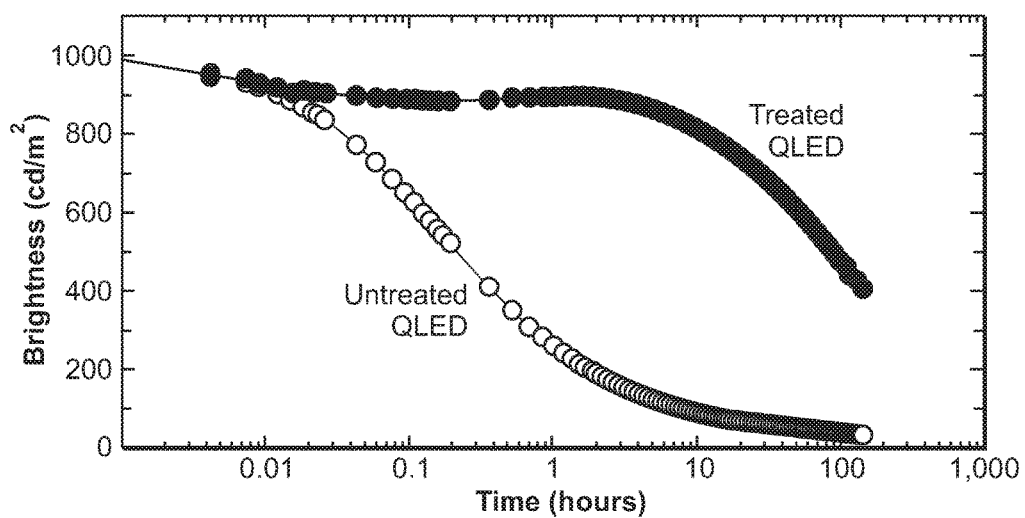
FIG. 5 illustrates comparative aging data for an example of a device in accordance with the present invention and a control device. (The initial luminance for all samples is 1000 Cd/m2. The initial (current, voltage) for the treated sample is (52 mA/cm2, 3.6V) and for the untreated sample is (190 mA/cm2, 6.0V).)

FIG. 5 shows improved device stability for the Treated devices. FIG. 5 graphically represents comparative aging data for a QLED (as described above) treated with water vapour (filled symbols) and a QLED (as described above) untreated (open symbols). The initial luminance for all samples is 1000 Cd/m². The initial current, voltage for the treated sample is 52 mA/cm², 3.6 V. The initial current, voltage for the untreated sample is 190 mA/cm², 6.0V.

Figure 6B:
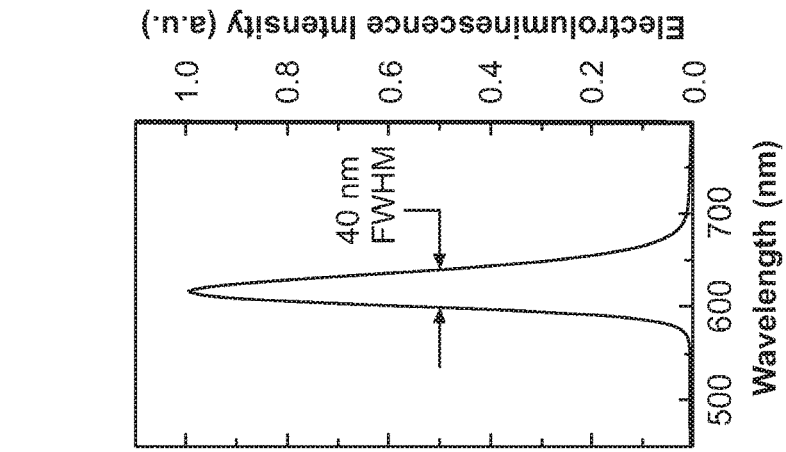
FIG. 6(b) depicts EL spectrum, with full width at half maximum (FWHM) of 40 nm.
Figure 6A:
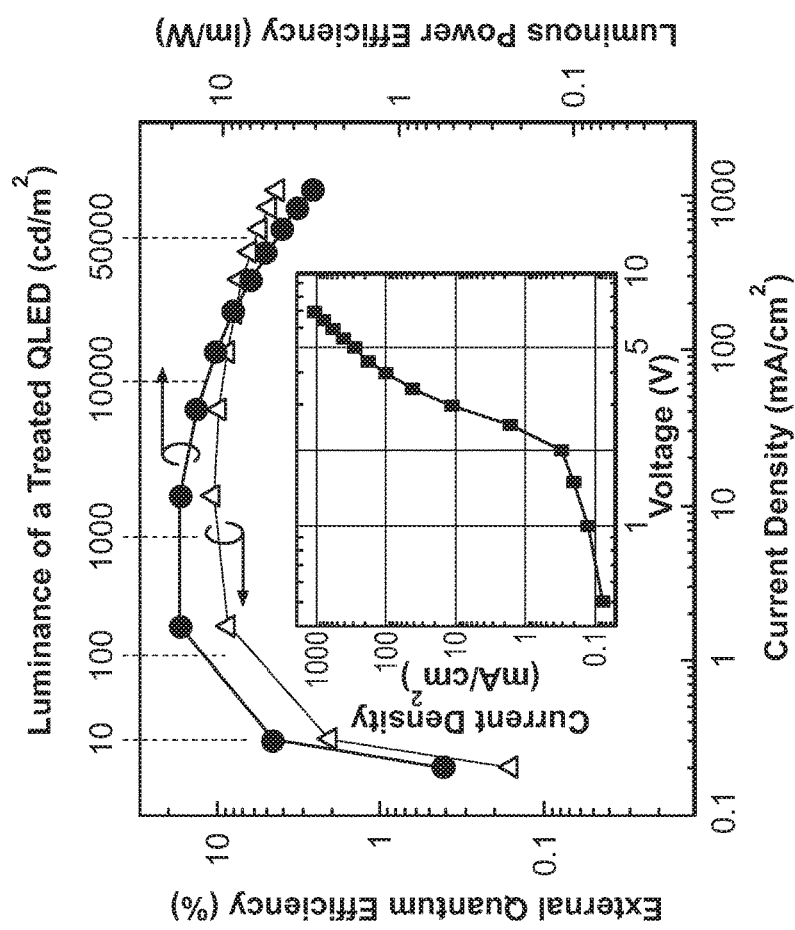
FIG. 6(a) depicts external quantum efficiency as a function of current, with the corresponding luminance indicated on the top axis. I-V characteristics are inset.

FIG. 6 shows high efficiency QLED performance data for a treated QLED. Device characteristics of a device in accordance with an embodiment of the invention are plotted in FIG. 6(a) along with the EL spectra in FIG. 6(b). FIG. 6(a) shows the external quantum efficiency as a function of current, with the corresponding luminance indicated on the top axis, characteristics are shown in a inset. Treated Devices demonstrate improved efficiencies at high brightness ranging from $\eta_{EQE}$=6.5% to 10.5%, and luminous power efficiencies greater than 17 lm/W at brightness levels between 1,000-2,000 Cd/m², with the peak emission wavelength at $\lambda$=618 nm. The data shows improved device efficiencies values and brightness values (up to 70,000 cd/m²). The EL spectrum shown in FIG. 6(b) has a full width at half maximum (FWHM) of 40 nm.

Treatment of the quantum dots by the small molecules (e.g., water vapour) and light (preferably small molecules and light) exposure can be followed by the device growth in high vacuum.

While not wishing to be bound by theory, improved performance of a device wherein the layer comprising quantum dots is treated with water vapour and light followed by device growth in high vacuum suggests that the water molecules are either chemisorbed or strongly physisorbed onto the surface of QDs to stay intact during the vacuum treatment.

Figure 7:
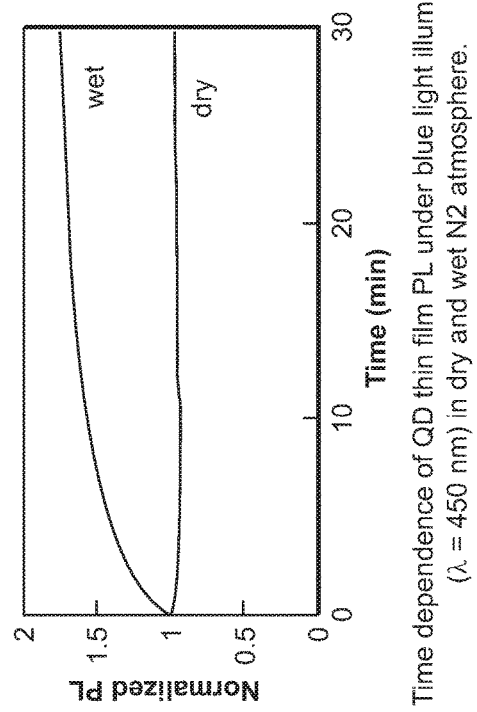
FIG. 7 illustrates photoluminescence of a layer including quantum dots under blue light illumination ($\lambda$=450 nm) in dry and wet $N_2$ atmosphere as a function of time.

FIG. 7 shows photoluminescence of a layer including quantum dots treated by wet nitrogen and dry nitrogen under blue light. FIG. 7 compares time dependence of PL when quantum dot layers, deposited on glass, are illuminated by blue light ($\lambda$=450 nm) in dry and wet $N_2$ atmosphere. In wet $N_2$ this process leads to a substantial PL increase (photobrightening) while in dry $N_2$ PL remains essentially constant.

Devices in accordance with the present invention can achieve peak external quantum efficiencies (EQEs) that can exceed 10%.

Devices in accordance with the present invention can achieve high brightness levels (>1000 Cd/m²) that would be suitable for information displays and lighting devices.

Light-emitting devices in accordance with various embodiments of the inventions described herein may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, a sign, lamps and various solid state lighting devices.

In certain embodiments, a device taught herein, includes, for example, a photovoltaic, a photodetector, a transistor, memory device, and other devices including a layer comprising quantum dots selected based upon absorption properties. The layer comprising quantum dots is included between a pair of electrodes. When included in such devices, quantum dots are engineered to produce a predetermined electrical response upon absorption of a particular wavelength, typically in the IR or MIR region of the spectrum. Such devices are known.

Quantum dots are known. In preferred embodiments, quantum dots comprise nanometer-scale inorganic semiconductor particles, more preferably, semiconductor nanocrystals. Quantum dots preferably have an average nanocrystal diameter less than about 150 Angstroms (Å), and most preferably in the range of 12-150 Å.

Quantum dots (including but not limited to semiconductor nanocrystals) preferably include a "core" of one or more first semiconductor materials, which may be surrounded by an overcoating or "shell" of a second semiconductor material.

A semiconductor core surrounded by a semiconductor shell is also referred to as a "core/shell" quantum dot.

Quantum dots are preferably members of a population of quantum dots having a narrow size distribution. More preferably, the quantum dots comprise a monodisperse or substantially monodisperse population of quantum dots. The monodisperse distribution of diameters can also be referred to as a size. In certain embodiments, the monodisperse population exhibits less than a 15% rms deviation in diameter of the quantum dots, preferably less than 10%, more preferably less than 5%.

In certain embodiments, semiconductor nanocrystals and other quantum dots are optionally surface modified, including, but not limited to, for example, having one or more ligand groups attached thereto.

In certain embodiment, the ligands can be derived from the coordinating solvent used during the growth process.

In certain embodiments, the surface can be modified by repeated exposure to an excess of a competing coordinating group to form an overlayer.

For example, a dispersion of the capped semiconductor nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the semiconductor nanocrystal, including, for example, phosphines, thiols, amines and phosphates. The semiconductor nanocrystal can be exposed to short chain polymers which exhibit an affinity for the surface and which terminate in a moiety having an affinity for a liquid medium in which the semiconductor nanocrystal is suspended or dispersed. Such affinity improves the stability of the suspension and discourages flocculation of the semiconductor nanocrystal.

In certain embodiments, for example, a coordinating ligand can have the formula:

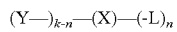

wherein k is 2, 3 4, or 5, and n is 1, 2, 3, 4 or 5 such that k-n is not less than zero; X is O, O—S, O—Se, O—N, O—P, O—As, S, S═O, SO$_2$, Se, Se═O, N, N═O, P, P═O, C═O As, or As═O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, phenanthryl.

A suitable coordinating ligand can be purchased commercially or prepared by ordinary synthetic organic techniques, for example, as described in J. March, Advanced Organic Chemistry.

Other ligands are described in U.S. patent application Ser. No. 10/641,292 for "Stabilized Semiconductor Nanocrystals", filed 15 Aug. 2003, which issued on 9 Jan. 2007 as U.S. Pat. No. 7,160,613, which is hereby incorporated herein by reference in its entirety.

Other examples of ligands include benzylphosphonic acid, benzylphosphonic acid including at least one substituent group on the ring of the benzyl group, a conjugate base of such acids, and mixtures including one or more of the foregoing. In certain embodiments, a ligand comprises 4-hydroxybenzylphosphonic acid, a conjugate base of the acid, or a mixture of the foregoing. In certain embodiments, a ligand comprises 3, 5-di-tert-butyl-4-hydroxybenzylphosphonic acid, a conjugate base of the acid, or a mixture of the foregoing.

Additional examples of ligands that may be useful with the present invention are described in International Application No. PCT/US2008/010651, filed 12 Sep. 2008, of Breen, et al., for "Functionalized Nanoparticles And Method" and International Application No. PCT/US2009/004345, filed 28 Jul. 2009 of Breen et al., for "Nanoparticle Including Multi-Functional Ligand And Method", each of the foregoing being hereby incorporated herein by reference.

The emission from a quantum dot capable of emitting light (e.g., a semiconductor nanocrystal) can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light (e.g., semiconductor nanocrystals) can result in emission of light in a narrow spectral range. The population can be monodisperse preferably exhibits less than a 15% rms (root-mean-square) deviation in diameter of such quantum dots, more preferably less than 10%, most preferably less than 5%. Spectral emissions in a narrow range of no greater than about 75 nm, no greater than about 60 nm, no greater than about 40 nm, and no greater than about 30 nm full width at half max (FWHM) for such quantum dots that emit in the visible can be observed. IR-emitting quantum dots can have a FWHM of no greater than 150 nm, or no greater than 100 nm Expressed in terms of the energy of the emission, the emission can have a FWHM of no greater than 0.05 eV, or no greater than 0.03 eV. The breadth of the emission decreases as the dispersity of the light-emitting quantum dot diameters decreases.

For example, semiconductor nanocrystals can have high emission quantum efficiencies such as greater than 10%, 20%, 30%, 40%, 50%, 60%, 70%, 80%, or 90%.

The narrow FWHM of quantum dots can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of quantum dots will emit light spanning a narrow range of wavelengths. A pattern including more than one size of quantum dots can emit light in more than one narrow range of wavelengths. The color of emitted light perceived by a viewer can be controlled by selecting appropriate combinations of quantum dot sizes and materials.

Transmission electron microscopy (TEM) can provide information about the size, shape, and distribution of a quantum dot population. Powder X-ray diffraction (XRD) patterns can provide the most complete information regarding the type and quality of the quantum dot. Estimates of size are also possible since particle diameter is inversely related, via the X-ray coherence length, to the peak width. For example, the diameter of quantum dots can be measured directly by transmission electron microscopy or estimated from X-ray diffraction data using, for example, the Scherrer equation. It also can be estimated from the UV/Vis absorption spectrum.

An emissive material can be deposited by spin-casting, screen-printing, inkjet printing, gravure printing, roll coating, drop-casting, Langmuir-Blodgett techniques, contact printing or other techniques known or readily identified by one skilled in the relevant art.

See also International Application No. PCT/US2008/007901 of Linton, et al., for "Compositions And Methods Including Depositing Nanomaterial", filed 25 Jun. 2008, the disclosure of which is hereby incorporated herein by reference in its entirety.

Semiconductor nanocrystals can be prepared and manipulated, for example, as described in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 entitled "Highly Luminescent Color-selective Materials" which are hereby incorporated herein by reference in their entireties. Other examples of the preparation and manipulation of semiconductor nanocrystals are described in U.S. Pat. Nos. 6,322,901 and 6,576,291, and U.S. Patent Application No. 60/550,314, each of which is hereby incorporated herein by reference in its entirety.

Other materials, techniques, methods, applications, and information that may be useful with the present invention are described in, International Application No. PCT/US2007/008873, filed Apr. 9, 2007, of Coe-Sullivan et al., for "Composition Including Material, Methods Of Depositing Material, Articles Including Same And Systems For Depositing Material"; International Application No. PCT/US2007/003411, filed Feb. 8, 2007, of Beatty, et al., for "Device Including Semiconductor Nanocrystals And A Layer Including A Doped Organic Material And Methods"; International Application No. PCT/US2007/003525, filed Feb. 8, 2007, of Coe-Sullivan, et al., for "Displays Including Semiconductor Nanocrystals And Methods Of Making Same"; International Application No. PCT/US2008/10651, of Breen, et al., for "Functionalized Nanoparticles And Method", filed 12 Sep. 2008, International Application No. PCT/US2007/013152, filed Jun. 4, 2007, of Coe-Sullivan, et al., for "Light-Emitting Devices And Displays With Improved Performance"; International Application No. PCT/US2007/24750, of Coe-Sullivan, et al., filed Dec. 3, 2007 "Improved Composites And Devices Including Nanoparticles"; International Application No. PCT/US2007/24310, filed Nov. 21, 2007, of Kazlas, et al., for "Light-Emitting Devices And Displays With Improved Performance"; International Application No. PCT/US2007/003677, filed Feb. 14, 2007, of Bulovic, et al., for "Solid State Lighting Devices Including Semiconductor Nanocrystals & Methods". The disclosures of each of the foregoing listed patent documents are hereby incorporated herein by reference in their entireties.

As used herein, the singular forms "a", "an" and "the" include plural unless the context clearly dictates otherwise. Thus, for example, reference to an emissive material includes reference to one or more of such materials.

As used herein, "top" and "bottom" are relative positional terms, based upon a location from a reference point. More particularly, "top" means furthest away from the substrate, while "bottom" means closest to the substrate. For example, for a light-emitting device including two electrodes, the bottom electrode is the electrode closest to the substrate, and is generally referred to as the first electrode fabricated; the top electrode is the electrode that is more remote from the substrate, on the top side of the light-emitting material. The bottom electrode has two surfaces, a bottom surface closest to the substrate, and a top surface farther away from the substrate. Where, e.g., a first layer is described as disposed or deposited "over" a second layer, the first layer is disposed further away from substrate. There may be other layers between the first and second layer, unless it is otherwise specified. For example, a cathode may be described as "disposed over" an anode, even though there are various organic and/or inorganic layers in between.

The entire contents of all patent publications and other publications cited in this disclosure are hereby incorporated herein by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. A method of preparing a film including an emissive layer comprising quantum dots, the method comprising:
   forming the emissive layer comprising quantum dots over a carrier substrate,
   fixing the emissive layer comprising quantum dots formed over the carrier substrate, and
   exposing at least a portion of exposed surfaces of the fixed emissive layer comprising quantum dots to small molecules to treat the at least a portion of the exposed quantum dot surfaces with small molecules, wherein the small molecules comprise a small polar molecule in a liquid state, and
   exposing all or a portion of exposed quantum dot surfaces to light flux in the presence of the small molecules.

2. A method in accordance with claim 1 wherein the small molecule includes no more than 50 atoms.

3. A method in accordance with claim 1 wherein the small molecule has a molecular weight of less than or equal to 100 a.m.u.

4. A method in accordance with claim 1 wherein exposure to small molecules is carried out in air.

5. A method in accordance with claim 1 wherein exposure to small molecules is carried out in the absence of oxygen.

6. A method in accordance with claim 1 wherein exposure to small molecules is carried out at a temperature in a range from about 20° to about 80° C.

7. A method in accordance with claim 1 wherein the light flux includes a peak emission wavelength in a range from about 365 nm to about 480 nm.

8. A method in accordance with claim 1 wherein the light flux includes a peak emission wavelength that can excite at least a portion of the quantum dots.

9. A method in accordance with claim 1 wherein the light flux is from about 10 to about 100 mW/cm$^2$.

10. A method in accordance with claim 1 wherein all or a portion of exposed surfaces of the fixed emissive layer comprising quantum dots is exposed to small molecules for at least about 30 seconds.

11. A method in accordance with claim 1 further comprising forming one or more other layers over the carrier substrate prior to forming the emissive layer comprising quantum dots.

12. A method in accordance with claim 1 further comprising forming one or more layers over the emissive layer comprising quantum dots after exposure to small molecules.

13. A method in accordance with claim 12 wherein method steps following exposure to light flux are carried out in absence of oxygen.

14. A method in accordance with claim 1 wherein the small molecules are included in a carrier medium.

15. A method in accordance with claim 1 wherein forming the emissive layer comprising quantum dots comprises applying an ink comprising quantum dots and a carrier liquid and removing the carrier liquid.

16. A method in accordance with claim 1 wherein forming the emissive layer comprising quantum dots comprises applying an ink comprising quantum dots and a carrier liquid and evaporating the carrier liquid.

17. A method in accordance with claim 1 wherein forming the emissive layer comprising quantum dots comprises applying an ink comprising quantum dots and a carrier liquid and evaporating the carrier liquid by vacuum evaporation.

18. A method in accordance with claim 1 wherein after evaporation of the liquid carrier, the emissive layer comprising quantum dots is heated in absence of oxygen to remove carrier liquid.

19. A method in accordance with claim 1 wherein exposing the emissive layer comprising quantum dots to small molecules comprises exposing the emissive layer in an atmosphere with a relative humidity from about 50% to about 85%.

20. A method in accordance with claim 1 wherein after exposure to small molecules, the emissive layer comprising quantum dots formed over the substrate is placed under vacuum of $10^{-6}$ torr or better in absence of oxygen.

* * * * *